(12) United States Patent
Nakamura et al.

(10) Patent No.: US 8,766,676 B2
(45) Date of Patent: Jul. 1, 2014

(54) DOWN CONVERTER AND CONTROL METHOD OF THE SAME

(71) Applicant: Renesas Electronics Corporation, Kawasaki (JP)

(72) Inventors: Yoshiaki Nakamura, Kawasaki (JP); Tatsuya Urakawa, Kawasaki (JP); Shigeya Suzuki, Kawasaki (JP); Jianqin Wang, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/898,406

(22) Filed: May 20, 2013

(65) Prior Publication Data
US 2013/0335124 A1 Dec. 19, 2013

(30) Foreign Application Priority Data

Jun. 14, 2012 (JP) .................................. 2012-134529

(51) Int. Cl.
*H03B 19/00* (2006.01)

(52) U.S. Cl.
USPC ............ 327/117; 327/105; 327/119; 455/334

(58) Field of Classification Search
USPC ....................... 327/141, 144–163; 331/15–17; 375/373–376
See application file for complete search history.

(56) References Cited

U.S. PATENT DOCUMENTS

| 5,859,570 | A | * | 1/1999 | Itoh et al. | 331/18 |
| 6,570,948 | B1 | * | 5/2003 | Marshall | 375/376 |
| 7,529,533 | B2 | * | 5/2009 | Bellantoni | 455/334 |
| 7,680,227 | B2 | * | 3/2010 | Kavadias et al. | 375/354 |
| 8,571,149 | B2 | * | 10/2013 | Shi et al. | 375/344 |
| 8,575,980 | B2 | * | 11/2013 | Tsuda | 327/156 |
| 2007/0111697 | A1 | * | 5/2007 | Bellantoni | 455/324 |
| 2007/0201565 | A1 | * | 8/2007 | Shi et al. | 375/259 |

FOREIGN PATENT DOCUMENTS

JP   2006-253885 A   9/2006

* cited by examiner

*Primary Examiner* — Brandon S Cole

(74) *Attorney, Agent, or Firm* — McGinn IP Law Group, PLLC

(57) ABSTRACT

A down converter has two down converter circuits. The one down converter circuit has a first mixer, a first ½ frequency-divider, and a first PLL. The other down converter circuit has a second mixer, a second ½ frequency-divider, and a second PLL. A difference frequency between a frequency of a local oscillation frequency signal of the second PLL and a frequency of a frequency-divided signal of the first ½ frequency-divider is higher than an upper limit of a receive frequency band of a tuner.

12 Claims, 15 Drawing Sheets

| POWER SUPPLY 151 | POWER SUPPLY 152 | POWER SUPPLY 153 |
|---|---|---|
| PLL 13 | PLL 23 | RF AMPLIFIER 121 |
| MIXER 11 | MIXER 21 | RF AMPLIFIER 122 |
| TONE/POLARIZATION CONTROL UNIT 17 | TONE/POLARIZATION CONTROL UNIT 27 | RF AMPLIFIER 123 |
| CRYSTAL OSCILLATOR 14 | CRYSTAL OSCILLATOR 24 | RF AMPLIFIER 124 |
|  |  | RF AMPLIFIER 125 |
|  |  | RF AMPLIFIER 126 |

FIG. 6

|  |  | ONE OF TUNERS IS ON | | | | BOTH OF TUNERS ARE ON | | | | BOTH OF TUNERS ARE OFF |
|---|---|---|---|---|---|---|---|---|---|---|
|  |  | MODE 1 | MODE 2 | MODE 3 | MODE 4 | MODE 5 | MODE 6 | MODE 7 | MODE 8 | MODE 9 |
| ON CIRCUIT |  | OUT1 ON (H: 18V) | OUT1 ON (V: 13V) | OUT1 OFF | OUT1 OFF | OUT1 ON | OUT1 ON | OUT1 ON | OUT1 ON | OUT1 OFF |
|  |  | OUT2 OFF | OUT2 OFF | OUT2 ON (H: 18V) | OUT2 ON (V: 13V) | OUT2 ON | OUT2 ON | OUT2 ON | OUT2 ON | OUT2 OFF |
|  |  | RF AMPLIFIER 121 | RF AMPLIFIER 121 | RF AMPLIFIER 121 | RF AMPLIFIER 121 | ALL EXCEPT RF AMPLIFIERS 125, 126 | ALL EXCEPT RF AMPLIFIERS 123, 124 | ALL EXCEPT RF AMPLIFIERS 124, 125 | ALL EXCEPT RF AMPLIFIERS 123, 126 | NONE |
|  |  | RF AMPLIFIER 122 | RF AMPLIFIER 122 | RF AMPLIFIER 122 | RF AMPLIFIER 122 |  |  |  |  |  |
|  |  | TONE/POLARIZATION CONTROL UNIT 17 | TONE/POLARIZATION CONTROL UNIT 17 | TONE/POLARIZATION CONTROL UNIT 27 | TONE/POLARIZATION CONTROL UNIT 27 |  |  |  |  |  |
|  |  | CRYSTAL OSCILLATOR 14 | CRYSTAL OSCILLATOR 14 | CRYSTAL OSCILLATOR 24 | CRYSTAL OSCILLATOR 24 |  |  |  |  |  |
|  |  | PLL 13 | PLL 13 | PLL 23 | PLL 23 |  |  |  |  |  |
|  |  | MIXER 11 | MIXER 11 | MIXER 21 | MIXER 21 |  |  |  |  |  |
|  |  | IF AMPLIFIER 16 | IF AMPLIFIER 16 | IF AMPLIFIER 26 | IF AMPLIFIER 26 |  |  |  |  |  |
|  |  | RF AMPLIFIER 125 | RF AMPLIFIER 125 | RF AMPLIFIER 123 | RF AMPLIFIER 126 |  |  |  |  |  |
| OFF CIRCUIT |  | CRYSTAL OSCILLATOR 24 | CRYSTAL OSCILLATOR 24 | CRYSTAL OSCILLATOR 14 | CRYSTAL OSCILLATOR 14 | RF AMPLIFIER 125 | RF AMPLIFIER 123 | RF AMPLIFIER 125 | RF AMPLIFIER 123 | ALL |
|  |  | PLL 23 | PLL 23 | PLL 13 | PLL 13 | RF AMPLIFIER 126 | RF AMPLIFIER 124 | RF AMPLIFIER 124 | RF AMPLIFIER 126 |  |
|  |  | MIXER 21 | MIXER 21 | MIXER 11 | MIXER 11 |  |  |  |  |  |
|  |  | TONE/POLARIZATION CONTROL UNIT 27 | TONE/POLARIZATION CONTROL UNIT 27 | TONE/POLARIZATION CONTROL UNIT 17 | TONE/POLARIZATION CONTROL UNIT 17 |  |  |  |  |  |
|  |  | IF AMPLIFIER 26 | IF AMPLIFIER 26 | IF AMPLIFIER 16 | IF AMPLIFIER 16 |  |  |  |  |  |
|  |  | RF AMPLIFIER 123 | RF AMPLIFIER 123 | RF AMPLIFIER 124 | RF AMPLIFIER 123 |  |  |  |  |  |
|  |  | RF AMPLIFIER 124 | RF AMPLIFIER 124 | RF AMPLIFIER 125 | RF AMPLIFIER 124 |  |  |  |  |  |
|  |  | RF AMPLIFIER 126 | RF AMPLIFIER 126 | RF AMPLIFIER 126 | RF AMPLIFIER 125 |  |  |  |  |  |

FIG. 13

| POWER SUPPLY 151 | POWER SUPPLY 152 | POWER SUPPLY 153 |
|---|---|---|
| PLL 13 | PLL 23 | RF AMPLIFIER 121 |
| MIXER 11 | MIXER 21 | RF AMPLIFIER 122 |
| TONE/POLARIZATION CONTROL UNIT 17 | TONE/POLARIZATION CONTROL UNIT 27 | RF AMPLIFIER 123 |
| CRYSTAL OSCILLATOR 51 | CRYSTAL OSCILLATOR 51 | RF AMPLIFIER 124 |
| | | RF AMPLIFIER 125 |
| | | RF AMPLIFIER 126 |

FIG. 14

| | | ONE OF TUNERS IS ON | | | | BOTH OF TUNERS ARE ON | | | | BOTH OF TUNERS ARE OFF |
|---|---|---|---|---|---|---|---|---|---|---|
| | | MODE 1 | MODE 2 | MODE 3 | MODE 4 | MODE 5 | MODE 6 | MODE 7 | MODE 8 | MODE 9 |
| | | OUT1 ON (H: 18V) | OUT1 ON (V: 13V) | OUT1 OFF | OUT1 OFF | OUT1 ON | OUT1 ON | OUT1 ON | OUT1 ON | OUT1 OFF |
| | | OUT2 OFF | OUT2 OFF | OUT2 ON (H: 18V) | OUT2 ON (V: 13V) | OUT2 ON | OUT2 ON | OUT2 ON | OUT2 ON | OUT2 OFF |
| ON CIRCUIT | | RF AMPLIFIER 121 | RF AMPLIFIER 121 | RF AMPLIFIER 121 | RF AMPLIFIER 121 | ALL EXCEPT RF AMPLIFIERS 125, 126 | ALL EXCEPT RF AMPLIFIERS 123, 124 | ALL EXCEPT RF AMPLIFIERS 124, 125 | ALL EXCEPT RF AMPLIFIERS 123, 126 | NONE |
| | | RF AMPLIFIER 122 | RF AMPLIFIER 122 | RF AMPLIFIER 122 | RF AMPLIFIER 122 | | | | | |
| | | TONE/POLARIZATION CONTROL UNIT 27 | TONE/POLARIZATION CONTROL UNIT 27 | TONE/POLARIZATION CONTROL UNIT 27 | TONE/POLARIZATION CONTROL UNIT 27 | | | | | |
| | | CRYSTAL OSCILLATOR 51 | CRYSTAL OSCILLATOR 51 | CRYSTAL OSCILLATOR 51 | CRYSTAL OSCILLATOR 51 | | | | | |
| | | PLL 13 | PLL 13 | PLL 23 | PLL 23 | | | | | |
| | | MIXER 11 | MIXER 11 | MIXER 21 | MIXER 21 | | | | | |
| | | IF AMPLIFIER 16 | IF AMPLIFIER 26 | IF AMPLIFIER 26 | IF AMPLIFIER 26 | | | | | |
| | | RF AMPLIFIER 125 | RF AMPLIFIER 126 | RF AMPLIFIER 123 | RF AMPLIFIER 124 | | | | | |
| OFF CIRCUIT | | PLL 23 | PLL 23 | PLL 13 | PLL 13 | RF AMPLIFIER 125 | RF AMPLIFIER 123 | RF AMPLIFIER 125 | RF AMPLIFIER 123 | ALL |
| | | MIXER 21 | MIXER 21 | MIXER 11 | MIXER 11 | RF AMPLIFIER 126 | RF AMPLIFIER 124 | RF AMPLIFIER 124 | RF AMPLIFIER 126 | |
| | | TONE/POLARIZATION CONTROL UNIT 17 | TONE/POLARIZATION CONTROL UNIT 17 | TONE/POLARIZATION CONTROL UNIT 17 | TONE/POLARIZATION CONTROL UNIT 17 | | | | | |
| | | IF AMPLIFIER 26 | IF AMPLIFIER 26 | IF AMPLIFIER 16 | IF AMPLIFIER 16 | | | | | |
| | | RF AMPLIFIER 123 | RF AMPLIFIER 123 | RF AMPLIFIER 123 | RF AMPLIFIER 123 | | | | | |
| | | RF AMPLIFIER 124 | RF AMPLIFIER 124 | RF AMPLIFIER 124 | RF AMPLIFIER 125 | | | | | |
| | | RF AMPLIFIER 126 | RF AMPLIFIER 126 | RF AMPLIFIER 126 | RF AMPLIFIER 126 | | | | | |

FIG. 16

| POWER SUPPLY 151 | POWER SUPPLY 152 | POWER SUPPLY 153 |
|---|---|---|
| PLL 13 | PLL 23 | RF AMPLIFIER 121 |
| MIXER 11 | MIXER 21 | RF AMPLIFIER 122 |
| TONE/POLARIZATION CONTROL UNIT 17 | TONE/POLARIZATION CONTROL UNIT 27 | |
| CRYSTAL OSCILLATOR 51 | CRYSTAL OSCILLATOR 51 | |
| RF AMPLIFIER 123 | RF AMPLIFIER 124 | |
| RF AMPLIFIER 125 | RF AMPLIFIER 126 | |

DOWN CONVERTER AND CONTROL METHOD OF THE SAME

CROSS-REFERENCE TO RELATED APPLICATIONS

The disclosure of Japanese Patent Application No. 2012-134529 filed on Jun. 14, 2012 including the specification, drawings and abstract is incorporated herein by reference in its entirety.

BACKGROUND

The present invention relates to a down converter and its control method, for example, to a down converter for down converting a received polarized wave signal and its control method.

There is known an LNB (Low Noise Block) down converter for converting a frequency of a received satellite broadcasting electric wave into an intermediate frequency (hereinafter, also called an IF frequency) that a receiver (e.g., tuner) can receive.

For example, Japanese Unexamined Patent Publication No. 2006-253885 discloses a receiver capable of receiving ground digital broadcasting and BS/CS broadcasting. The receiver described in Japanese Unexamined Patent Publication No. 2006-253885 has a local oscillation circuit for ground waves and a local oscillation circuit for BS/CS. Then, when the receiver is tuned to a BS/CS broadcasting wave, the receiver controls so that an oscillation frequency of the local oscillation circuit for ground waves may become a frequency that does not overlap frequency bands of the BS/CS broadcasting waves. This prevents deterioration of receiver performance.

SUMMARY

However, when considering a down converter of a universal dual configuration, the converter needs to output two IF signals to two tuners simultaneously. In order to output the IF signal to each of the two tuners, both local oscillation circuits need to function. Therefore, it is impossible to change the oscillation frequency of the mixer for modulating one of the broadcasting waves that is not used (one that is not tuned to) to an arbitrary frequency that does not overlap frequency bands of other broadcasting waves, as described in Japanese Unexamined Patent Publication No. 2006-253885. Therefore, it is impossible to prevent a local oscillation frequency signal generated in the local oscillation circuit provided in one of signal lines from coupling with the other signal line, which will cause a spurious signal. As a result, there was a problem that the tuner provided on the output side of the down converter erroneously received the generated spurious signal as the IF signal.

Other problems and new characteristics will become clear apparent from the description of the invention and accompanying drawings thereof.

According to an aspect of the present invention, a down converter has: an amplification unit that has a first amplifier to which a first polarized wave signal is supplied, and a second amplifier to which a second polarized wave signal is supplied; a first down converter circuit that has a first reference signal generation unit for generating a first reference signal, a first local oscillation unit for generating a first local oscillation frequency signal using the first reference signal, a first frequency-divider for generating a first frequency-divided signal obtained by frequency dividing the first local oscillation frequency signal, and a first frequency conversion unit for converting a signal amplified by the amplification unit into a first intermediate frequency signal using the first frequency-divided signal; and a second down converter circuit that has a second reference signal generation unit for generating a second reference signal having a second reference frequency, a second local oscillation unit for generating a second local oscillation frequency signal using the second reference signal, a second frequency-divider for generating a second frequency-divided signal obtained by frequency dividing the second local oscillation frequency signal, and a second frequency conversion unit for converting a signal amplified by the amplification unit into a second intermediate frequency signal using the second frequency-divided signal. A difference frequency between a frequency of the second local oscillation frequency signal and a frequency of the first frequency-divided signal is higher than an upper limit of the receive frequency band of a first receiver for receiving the first intermediate frequency signal.

According to another aspect of the present invention, a method for controlling a down converter is a method for controlling the down converter having: an amplification unit that has the first amplifier to which the first polarized wave signal is supplied, and the second amplifier to which the second polarized wave signal is supplied; the first down converter circuit that has the first reference signal generation unit for generating the first reference signal, the first local oscillation unit for generating the first local oscillation frequency signal using the first reference signal, the first frequency-divider for generating the first frequency-divided signal obtained by frequency dividing the first local oscillation frequency signal, and the first frequency conversion unit for converting the signal amplified by the amplification unit into the first intermediate frequency signal using the first frequency-divided signal; and the second down converter circuit that has the second reference signal generation unit for generating the second reference signal having the second reference frequency, the second local oscillation unit for generating the second local oscillation frequency signal using the second reference signal, the second frequency-divider for generating the second frequency-divided signal obtained by frequency dividing the second local oscillation frequency signal, and the second frequency conversion unit for converting the signal amplified by the amplification unit into the second intermediate frequency signal using the second frequency-divided signal. The oscillation frequency of the second local oscillation unit is controlled so that the difference frequency between the frequency of the second local oscillation frequency signal and the frequency of the first frequency-divided signal may become higher than the upper limit of the receive frequency band of the first receiver for receiving the first intermediate frequency signal.

By the present invention, even in the case where it is of the universal dual configuration that outputs multiple IF signals, the down converter capable of reducing an influence of the spurious signal and its control method can be provided.

BRIEF DESCRIPTION OF THE DRAWINGS

FIG. 6 is a table for explaining an operation of the down converter according to the first embodiment;

FIG. 13 is a table for explaining the supply destinations of electric power in the down converter according to the second embodiment;

FIG. 14 is a table for explaining an operation of the down converter according to the second embodiment;

FIG. 16 is a table for explaining the supply destinations of electric power in the down converter according to the third embodiment.

DETAILED DESCRIPTION

First Embodiment

Figure 1:
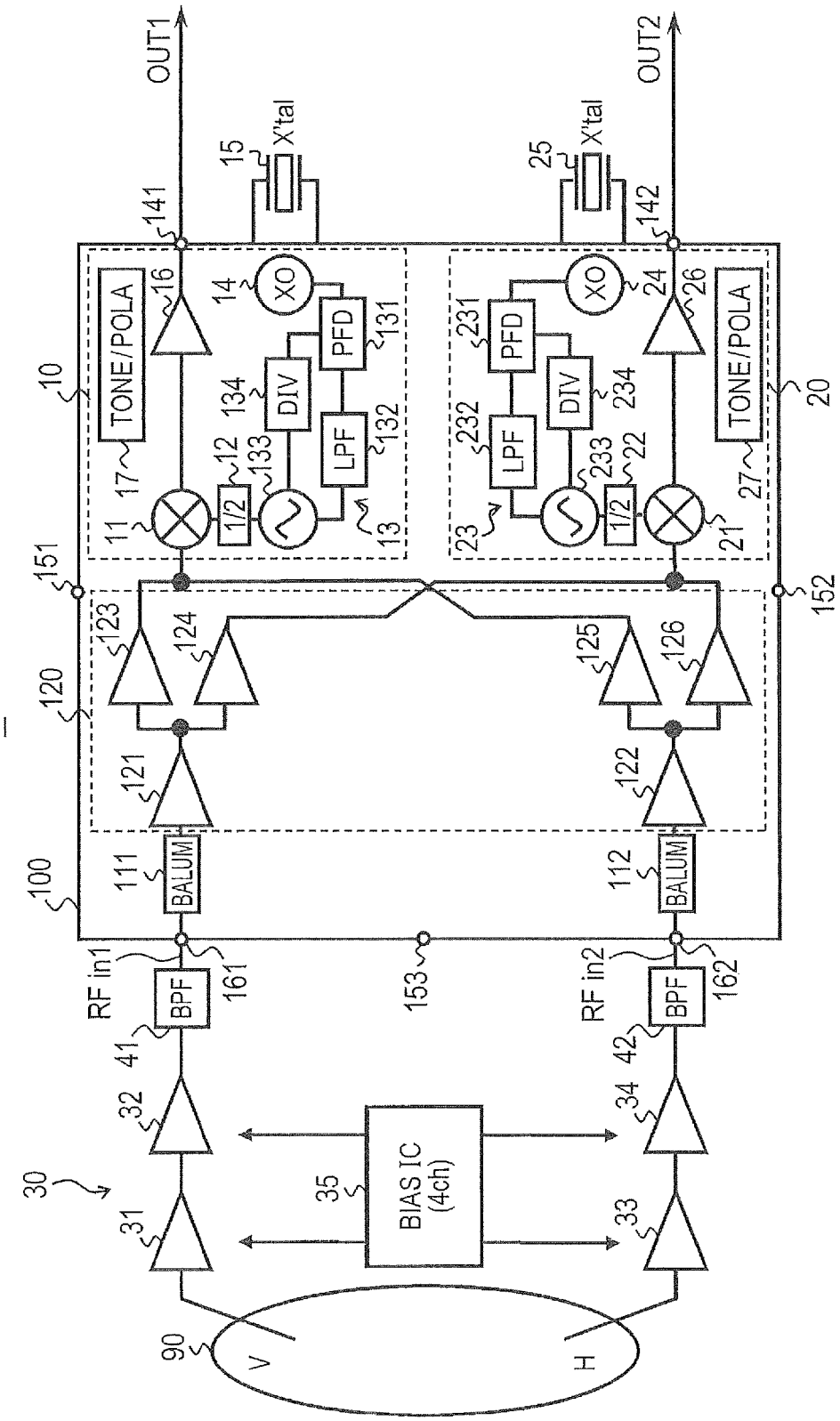
FIG. 1 is a block diagram of a down converter according to a first embodiment.

Hereinafter, a down converter 1 according to a first embodiment will be described with reference to drawings. The down converter 1 shown in FIG. 1 is, for example, a down converter of a universal dual configuration that can output two IF signals in conformity with a specification of DiSEqC (Digital Satellite Equipment Control). That is, the down converter 1 shown in FIG. 1 receives a vertically polarized wave signal V (a first polarized wave signal) and a horizontally polarized wave signal H (a second polarized wave signal) with a single feed horn 90, and outputs IF signals OUT1, OUT2 after down-conversion from a down converter circuit 10 and a down converter circuit 20, respectively. The down converter 1 has a preamplifier unit 30, band-pass filters 41, 42, and a down convert IC 100.

The preamplifier unit 30 has RF amplifiers 31 to 34 and a bias IC 35. The RF amplifiers 31 to 34 are amplifiers that use HJFETs (Hetero-Junction-FETs). The RF amplifiers 31, 32 amplify the vertically polarized wave signal V received with the feed horn 90, and output it to the band-pass filter 41. The RF amplifiers 33, 34 amplify the horizontally polarized wave signal H received with the feed horn 90, and output it to the band-pass filter 42. The bias IC 35 supplies electric power to the RF amplifiers 31 to 34.

<Configuration of Down Convert IC 100>

The down convert IC 100 has baluns 111, 112, an amplification unit 120, the down converter circuit 10, and the down converter circuit 20. The down convert IC 100 is a single IC chip, is inputted with two RF signals, and outputs two IF signals. That is, the baluns 111, 112, the amplification unit 120, the down converter circuit 10, and the down converter circuit 20 are mounted on the single IC chip.

One end of the balun 111 is coupled to an input terminal 161, and an other end thereof is coupled to the amplification unit 120. One end of the balun 112 is coupled to an input terminal 162, and an other end thereof is coupled to the amplification unit 120. Each of the baluns 111, 112 contains a transformer, converts a single-ended signal into a differential signal, and outputs it to the amplification unit 120 (specifically an RF amplifier 121 and an RF amplifier 122). An NF characteristic of a system can be improved by converting input signals RFin1, RFin2 into a differential signal.

The amplification unit 120 amplifies the vertically polarized wave signal V and the horizontally polarized wave signal H that are inputted from the baluns 111, 112, and outputs them to the down converter circuit 10 and the down converter circuit 20, respectively. The amplification unit 120 has the RF amplifier 121 to an RF amplifier 126 (a first RF amplifier to a sixth RF amplifier).

Input terminals of the RF amplifiers 123, 124 are commonly coupled to an output terminal of the RF amplifier 121. Output terminals of the RF amplifiers 123, 124 are commonly coupled to an input terminal of the down converter circuit 10 (specifically a mixer 11). Input terminals of the RF amplifiers 125, 126 are commonly coupled to an output terminal of the RF amplifier 122. Output terminals of the RF amplifiers 125, 126 are commonly coupled to an input terminal of the down converter circuit 20 (specifically a mixer 21).

The RF amplifier 121 amplifies a signal inputted from the balun 111, and outputs it to the RF amplifiers 123, 124. The RF amplifier 122 amplifies a signal inputted from the balun 112, and outputs it to the RF amplifiers 125, 126.

The RF amplifier 123 amplifies the signal inputted from the RF amplifier 121, and outputs it to the mixer 11 of the down converter circuit 10. The RF amplifier 124 amplifies the signal inputted from the RF amplifier 121, and outputs it to the mixer 21 of the down converter circuit 20.

Similarly, the RF amplifier 125 amplifies a signal inputted from the RF amplifier 122, and outputs it to the mixer 11 of the down converter circuit 10. The RF amplifier 126 amplifies a signal inputted from the RF amplifier 122, and outputs it to the mixer 21 of the down converter circuit 20.

<Configuration of Down Converter Circuit 10>

The down converter circuit 10 (a first down converter circuit) generates the IF signal (a first intermediate frequency signal) by down converting the vertically polarized wave signal V outputted from the RF amplifier 123 or the horizontally polarized wave signal H outputted from the RF amplifier 125. Then, the down converter circuit 10 outputs the generated IF signal from its output terminal 141.

The down converter circuit 10 has the mixer 11, a ½ frequency-divider 12, a PLL (Phase-locked Loop) 13, a crystal oscillator (XO: Crystal Oscillator) 14, a crystal resonator (X'tal) 15, an IF amplifier 16, and a Tone/Polarization control unit 17.

The mixer 11 (a first frequency conversion unit) down converts (modulates) the vertically polarized wave signal V outputted from the RF amplifier 123 or the horizontally polarized wave signal H outputted from the RF amplifier 125 using a frequency-divided signal outputted from the ½ frequency-divider 12. The mixer 11 outputs the down-converted signal (the IF signal) to the IF amplifier 16.

The ½ frequency-divider 12 (a first frequency-divider) frequency divides a local oscillation frequency signal (a first local oscillation frequency signal) outputted from the PLL 13 to generate a frequency-divided signal (a first frequency-divided signal). To be specific, the ½ frequency-divider 12 generates a frequency-divided signal such that the local oscillation frequency signal outputted from the PLL 13 is made ½ (half), and outputs it to the mixer 11 as an LO signal.

The PLL 13 (a first local oscillation unit) has a phase comparator (PFD: Phase Frequency Detector) 131, a low-pass filter (LPF: Low-pass filter) 132, a VCO (Voltage Controlled Oscillator) 133, and a frequency-divider (DIV: Frequency-divider) 134.

A reference signal generated by the crystal oscillator 14 and a signal that is frequency divided by the frequency-divider 134 are inputted into the phase comparator 131. The phase comparator 131 generates a signal such that a phase difference of these signals is converted into a voltage and outputs it to the low-pass filter 132. The low-pass filter 132 removes an undesired component contained in the signal outputted from the phase comparator 131. The VCO 133 controls a frequency of the output signal according to a voltage of the signal outputted from the low-pass filter 132. The output signal generated by the VCO 133 is outputted to the ½ frequency-divider 12 as the local oscillation frequency signal.

Moreover, the local oscillation frequency signal outputted from the VCO 133 is frequency divided in the frequency-divider 134, and is inputted into the phase comparator 131. At this time, the frequency-divider 134 is configured to be capable of altering a frequency division ratio according to a control signal outputted from an unillustrated control circuit. A frequency of the local oscillation frequency signal can be altered by altering the frequency division ratio. In this embodiment, the VCOs 133, 233 can output local oscillation frequency signals (19.5 GHz and 21.2 GHz) selectively.

The crystal oscillator 14 (a first reference signal generation unit) generates a reference signal (a first reference signal) having a predetermined reference frequency, and outputs it to the PLL 13. The crystal oscillator 14 generates the reference signal using the X'tal 15. Then, the PLL 13 generates the local oscillation frequency signal using the reference signal as described above.

The IF amplifier 16 amplifies the IF signal outputted from the mixer 11, and outputs it to the output terminal 141 of the down convert IC 100.

A Tone/Polarization signal is inputted into the Tone/Polarization control unit 17 from an unillustrated control signal input terminal. The Tone/Polarization control unit 17 controls the PLL 13, the crystal oscillator 14, the amplification unit 120, etc. according to the inputted Tone/Polarization signal.

<Configuration of Down Converter Circuit 20>

The down converter circuit 20 (a second down converter circuit) generates the IF signal (a second intermediate frequency signal) by down converting the horizontally polarized wave signal H outputted from the RF amplifier 124 or the vertically polarized wave signal V outputted from the RF amplifier 126. Then, the down converter circuit 20 outputs the generated IF signal from an output terminal 142.

The down converter circuit 20 has the mixer 21, a ½ frequency-divider 22, a PLL 23, a crystal oscillator 24, a X'tal 25, an IF amplifier 26, and a Tone/Polarization control unit 27.

The mixer 21 (the second frequency conversion unit) down converts (modulates) the horizontally polarized wave signal H outputted from the RF amplifier 124 and the vertically polarized wave signal V outputted from the RF amplifier 126 using the frequency-divided signal outputted from the ½ frequency-divider 22. The mixer 21 outputs the down-converted signal (the IF signal) to the IF amplifier 26.

The ½ frequency-divider 22 (the second frequency-divider) frequency divides a local oscillation frequency signal (a second local oscillation frequency signal) outputted from the PLL 23 to generate a frequency-divided signal (a second frequency-divided signal). To be specific, the ½ frequency-divider 22 generates the frequency-divided signal such that a frequency of the local oscillation frequency signal outputted from the PLL 23 is made ½ (half), and outputs it to the mixer 21 as the LO signal.

The PLL 23 (a second local oscillation unit) has a phase comparator (PFD) 231, a low-pass filter (LPF) 232, a VCO 233, and a frequency-divider 234 (DIV). Incidentally, since a configuration and an operation of the PLL 23 are the same as the configuration and the operation of the above-mentioned PLL 13, their explanations are omitted.

The crystal oscillator 24 (a second reference signal generation unit) generates a reference signal (a second reference signal) having a predetermined reference frequency, and outputs it to the PLL 23. The crystal oscillator 24 generates the reference signal using the crystal resonator 25. Then, the PLL 23 generates the local oscillation frequency signal using the reference signal.

The IF amplifier 26 amplifies the IF signal outputted from the mixer 21, and outputs it to the output terminal 142 of the down convert IC 100.

The Tone/Polarization signal is inputted into the Tone/Polarization control unit 27 from an unillustrated control signal input terminal. The Tone/Polarization control unit 27 controls the PLL 23, the crystal oscillator 24, the amplification unit 120, etc. according to the inputted Tone/Polarization signal.

<Power Supply Configuration of Down Converter 1>

Figure 2:
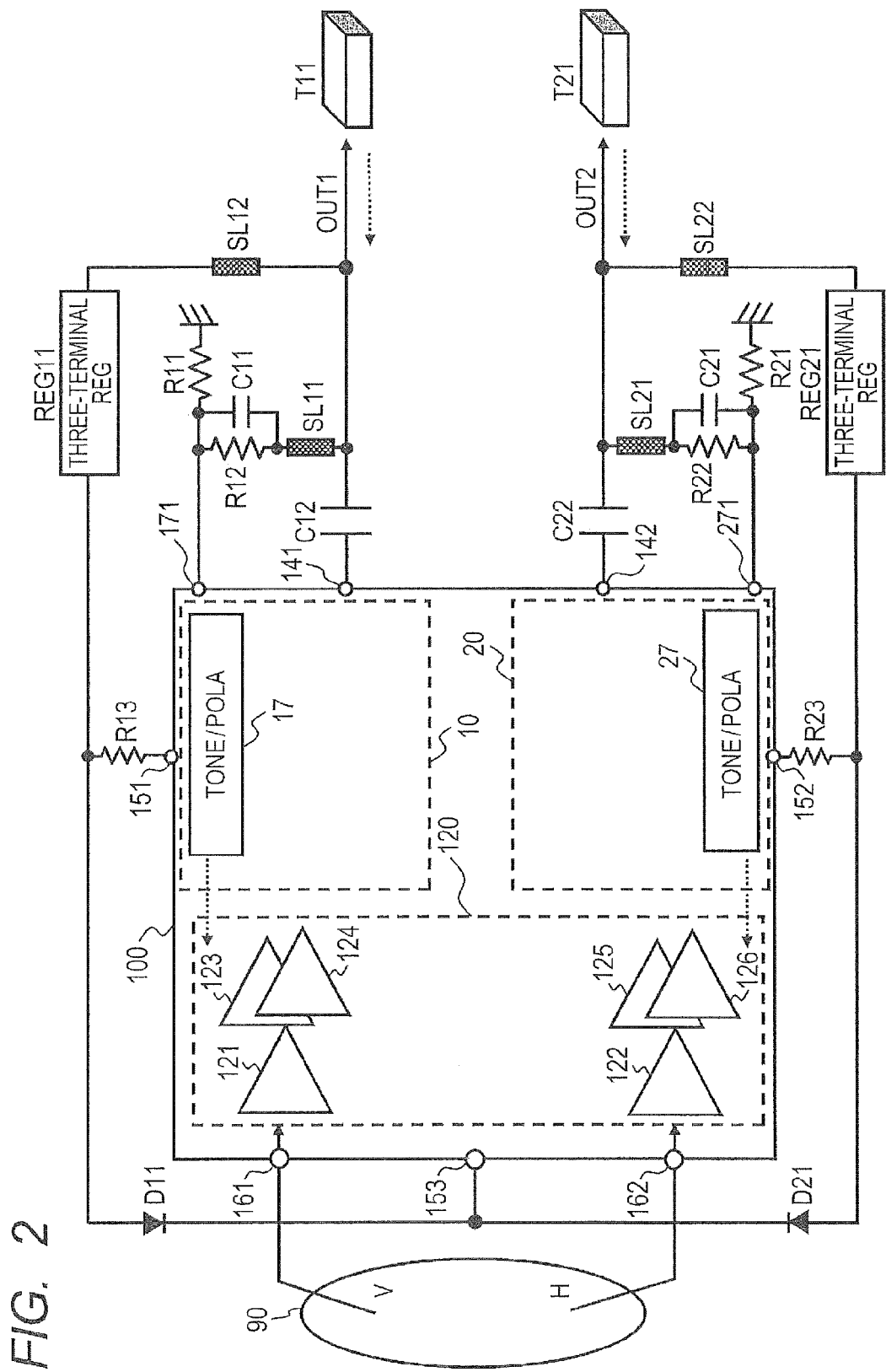
FIG. 2 is a diagram for explaining an electric power supply in the down converter according to the first embodiment.

FIG. 2 is a diagram for explaining a case where electric power and the Tone/Polarization signal of the down converter 1 shown in FIG. 1 are supplied. The IF signal OUT1 that was down converted by the down converter circuit 10 is outputted from the output terminal 141, is striped of its DC component by a capacitative element C12, and is supplied to a tuner T11 (a first receiver) through a cable. On the other hand, the tuner T11 supplies the electric power and the Tone/Polarization signal to the down converter circuit 10 through the same cable as the cable through which the IF signal OUT1 is transmitted. Here, DC components (a DC voltage signal of 18 V, a DC voltage signal of 13 V) of the Tone/Polarization signal are supplied to the down converter circuit 10 as electric powers.

The DC component (13 V or 18 V) of the Tone/Polarization signal is supplied to a three-terminal regulator REG11 through a stripline SL12. The three-terminal regulator REG11 regulates the voltage of 13 V or 18 V to a voltage suited to a rating of the down converter circuit 10, and supplies it to a power supply terminal 151 (a first power supply terminal).

Moreover, the three-terminal regulator REG11 regulates the voltage of 13 V or 18 V to a voltage suited to a rating of the amplification unit 120 (the RF amplifiers 121 to 126), and supplies electric power to a power supply terminal 153 (a third power supply terminal). Incidentally, when the voltage that should be supplied to the down converter circuit 10 is lower than the voltage that should be supplied to the amplification unit 120, a resistance element R13 may be provided in front of the power supply terminal 151, as shown in FIG. 2.

Furthermore, the Tone/Polarization signal is supplied to a resistance element R12 and a capacitative element C11 through a stripline SL11. Here, a DC component of the Pola signal is divided by a resistance element R11 and the resistance element R12. That is, the Pola signal is lowered to a voltage suited to the rating of the down converter circuit 10 using the resistance element R11 and the resistance element R12, and is supplied to the Tone/Polarization control unit 17 through a control signal terminal 171. On the other hand, the Tone signal passes through the capacitive element C11 and existence of a pulse is detected inside the down converter circuit 10.

Similarly, the IF signal OUT2 that is down converted by the down converter circuit 20 is stripped of its DC component by a capacitative element C22, and is supplied to a tuner T21 (a second receiver) through a cable. On the other hand, the tuner T21 supplies electric power and the Tone/Polarization signal to the down converter circuit 20 through the same cable as the cable that transmitted the IF signal OUT2. Here, the DC components (the DC voltage signal of 18 V, the DC voltage signal of 13 V) of the Tone/Polarization signal are supplied to the down converter circuit 20 as electric power.

The DC component (13 V or 18 V) of the Tone/Polarization signal is supplied to a three-terminal regulator REG21 through a stripline SL22. The three-terminal regulator REG21 regulates the voltage of 13 V or 18 V to a voltage suited to a rating of the down converter circuit 20, and supplies it to a power supply terminal 152 (a second power supply terminal).

Moreover, the three-terminal regulator REG21 regulates the voltage of 13 V or 18 V to a voltage suited to the rating of the amplification unit 120 (the RF amplifiers 121 to 126), and supplies electric power to the power supply terminal 153. Incidentally, in the case where the voltage that should be supplied to the down converter circuit 20 is lower than the voltage that should be amplified to the amplification unit 120, a resistance element R23 may be provided in front of the power supply terminal 152, as shown in FIG. 2.

Furthermore, the Tone/Polarization signal is supplied to a resistance element R22 and a capacitative element C21 through a stripline SL21. Here, the DC component of the Pola signal is divided by a resistance element R21 and the resistance element R22. That is, the Pola signal is lowered to a voltage suited to the rating of the down converter circuit 20 using the resistance element R21 and the resistance element R22, and is supplied to the Tone/Polarization control unit 27 through a control signal terminal 271. On the other hand, the Tone signal passes through the capacity C21 and existence of a pulse is detected inside the down converter circuit 20.

Incidentally, an output terminal of the three-terminal regulator REG11 and an output terminal of the three-terminal regulator REG21 are commonly coupled to the power supply terminal 153. At this time, a diode D11 is provided between the output terminal of the three-terminal regulator REG11 and the power supply terminal 153. Moreover, a diode D21 is provided between the output terminal of the three-terminal regulator REG21 and the power supply terminal 153. For this reason, even when an output of either of the three-terminal regulators REG11, REG21 turns OFF, the other is not affected.

Figure 3:
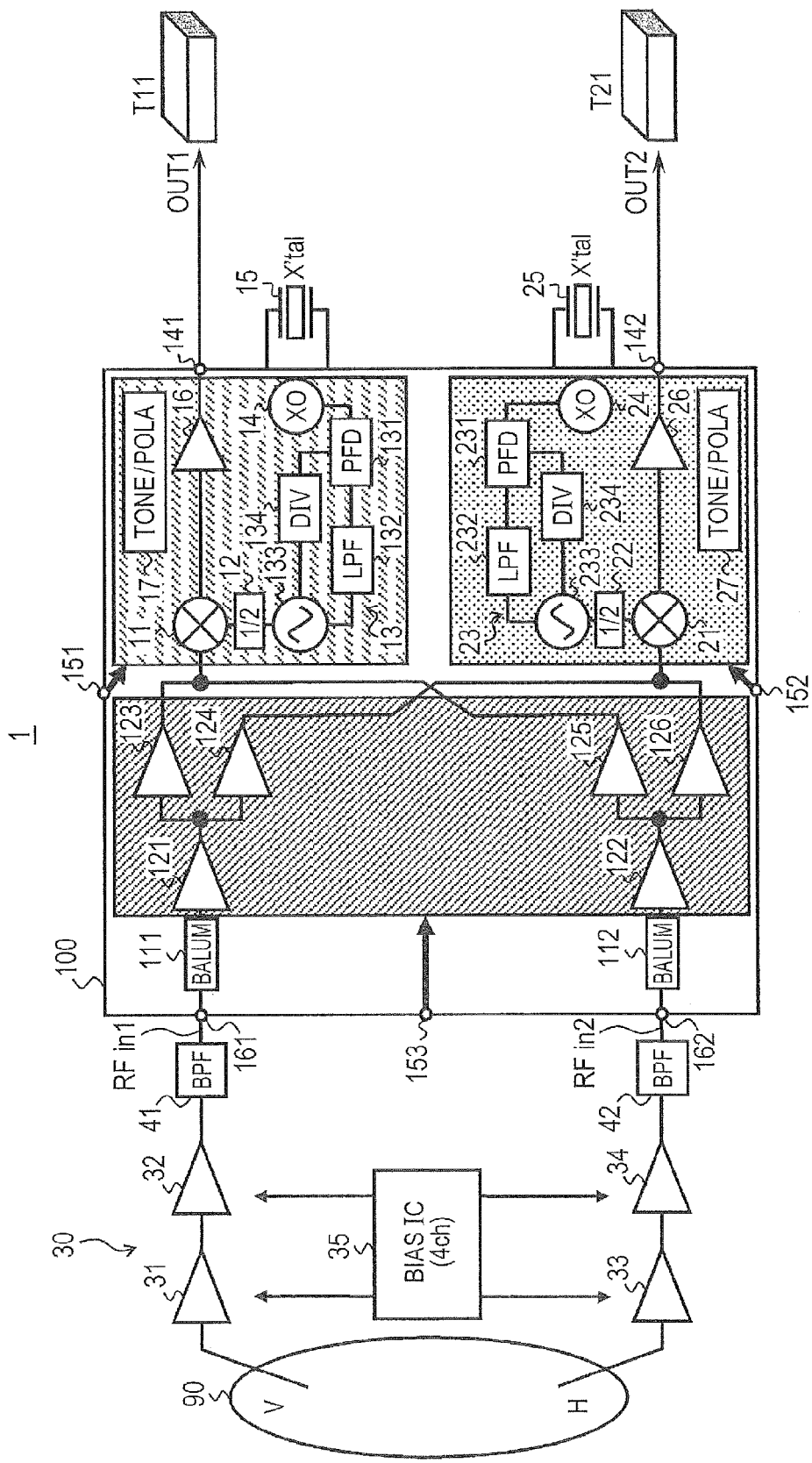
FIG. 3 is a diagram for explaining supply destinations of electric power in the down converter according to the first embodiment.
Figures 4, 5:
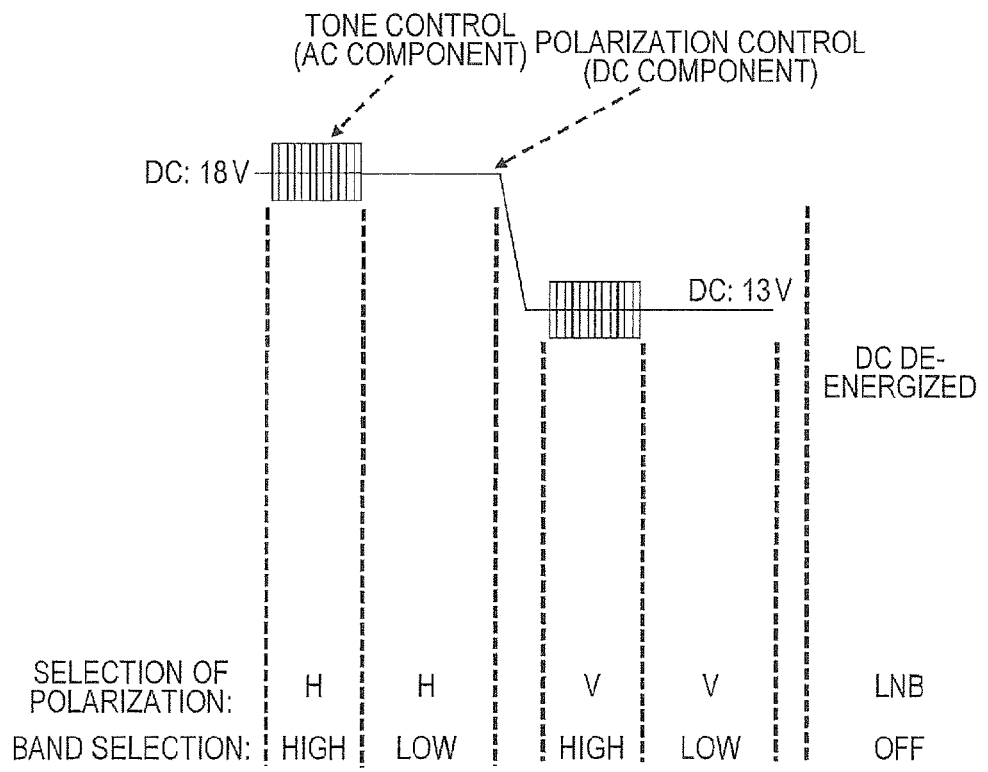
FIG. 4 is a table for explaining the supply destinations of electric power in the down converter according to the first embodiment.
FIG. 5 is a diagram for explaining an operation of a Tone/Polarization control unit according to the first embodiment.

Next, a power supply configuration and a power save function of the down converter 1 according to this embodiment will be explained using FIG. 3 and FIG. 4. FIG. 3 is a block diagram showing supply destinations of electric power of the power supply terminals 151 to 153. Circuit blocks included in an area of the same hatching are supplied with electric power from the same power supply terminal. FIG. 4 is a table showing supply destinations of the electric power of the power supply terminals 151 to 153.

The electric power is supplied to the power supply terminal 151 from the tuner T11 through the three-terminal regulator REG11. The electric power supplied to the power supply terminal 151 is supplied to the down converter circuit that is a block necessary for reception of the Tone/Polarization signal, a down conversion processing, and an IF signal output processing. To be specific, the electric power supplied to the power supply terminal 151 is supplied to the mixer 11, the PLL 13, the crystal oscillator 14, the IF amplifier 16, and the Tone/Polarization control unit 17.

Similarly, electric power supplied from the tuner T21 of FIG. 2 is supplied to the power supply terminal 152 through the three-terminal regulator REG21. The electric power supplied to the power supply terminal 152 is supplied to the down converter circuit 20. To be specific, the electric power supplied to the power supply terminal 152 is supplied to the mixer 21, the PLL 23, the crystal oscillator 24, the IF amplifier 26, and the Tone/Polarization control unit 27.

At this time, the down converter circuit 10 is a circuit for outputting the IF signal (the OUT1) to the tuner T11 coupled to the output terminal 141, and the down converter circuit 20 is a circuit for outputting the IF signal (the OUT2) to the tuner T21 coupled to the output terminal 142. By adopting the power supply configuration shown in FIG. 3, it is possible to distinguish clearly that the down converter circuit 10 is a circuit block for the tuner T11 and the down converter circuit 20 is a circuit block for the tuner T21 in the circuit blocks of the down convert IC 100.

On the other hand, the RF amplifier 121 bunches the vertically polarized wave signals V that enter the RF amplifiers 123, 124 at an entrance of the down convert IC 100. Therefore, the RF amplifier 121 is used also when supplying the vertically polarized wave signal V in a direction of the tuner T11 (the down converter circuit 10) and also when supplying it in a direction of the tuner T21 (the down converter circuit 20).

Similarly, the RF amplifier 122 bunches the horizontally polarized wave signals V that enter the RF amplifiers 125, 126 at an entrance of the down convert IC 100. Therefore, the RF amplifier 122 is used also when supplying the horizontally polarized wave signal H in the direction of the tuner T11 (the down converter circuit 10) and also when supplying it in the direction of the tuner T21 (the down converter circuit 20). That is, the RF amplifiers 121, 122 cannot be clearly divided into one for the tuner T11 and one for the tuner T21.

For this reason, the RF amplifiers 121, 122 need to be always ON, except when both of the tuner T11 and the tuner T21 turn OFF (when the down convert IC 100 turns OFF completely). Therefore, in the down convert IC 100, the power supply terminal 153 is provided in addition to the power supply terminals (the power supply terminal 151 and the power supply terminal 152) that are supplied with electric power from the tuner T11 and the tuner T21 alone. The power supply terminal 153 is being coupled to both of the tuner T11 and the tuner T21, and is a power supply terminal that is supplied with electric power from the both.

Thereby, the amplification unit 120 becomes always ON, not being influenced by ON/OFF of the tuner T11 and the tuner T21, unless the down convert IC 100 is in an OFF state (as long as both of the tuner T11 and the tuner T21 are not OFF). That is, the RF amplifiers 121, 122 become always ON irrespective of the ON/OFF of the tuner T11 and the tuner T21. As a result, the RF amplifiers 121, 122 will be capable of operations if being supplied with electric power from either of the three-terminal regulators.

Since adapting such a power supply configuration enables electric power to be supplied only to a circuit block that needs to be operated, not to the whole down converter IC 100, power consumption can be suppressed. Furthermore, dividing the power supply terminals of the down converter circuits 10, 20 and the amplification unit 120 enables the power supplies of the RF amplifiers 121 to 126 to be separated from other circuit blocks. This makes it possible to prevent noise components originating in the down converter circuits 10, 20 from taking a roundabout path through the power supply terminal, and to improve the NF characteristic of the system.

<Operation of Down Converter 1>

Next, an operation of the down converter 1 according to this embodiment will be explained. First, a general operation of the down converter 1 will be explained.

First, as shown in FIG. 1, the RF signal sent from a satellite is received with the feed horn 90. Next, the RF signal is amplified by the preamplifier unit 30, and is inputted into the down convert IC 100 through the band-pass filters 41, 42. When the RF signal of around 10 GHz is inputted into the down convert IC 100, it is down converted into the IF signal of about 1-2 GHz in the mixers 11, 21. To be specific, the mixer 11 generates the IF signal using a frequency-divided signal. That is, the mixer 11 down converts the inputted RF signal using the frequency-divided signal as the LO signal.

Incidentally, although the RF signal sent from the satellite is different channel by channel, an operation of which signal (a polarized wave and a Band) should be selected and outputted to the tuner will be based on a certain specification. One of the specifications is a control specification called DiSEqC (Digital Satellite Equipment Control) that is adopted in the down converter 1, and the specification and the RF signal from the satellite will be described in detail below.

The DiSEqC control will be explained with reference to FIG. 5. First, there are two kinds of signals sent from the satellite: one is of a horizontal polarization (H); and the other is of a vertical polarization (V). There are also two kinds in Band: one is in High Band (11.7 to 12.75 GHz); and the other is in Low Band (10.7 to 11.7 GHz). That is, the signals that the down converter 1 can receive are a total four kinds of signals: the above-mentioned two kinds of polarized waves X two kinds of Bands. The down converter 1 switches these four kinds of signals in accordance with a request from the tuner.

The polarized wave and the Band selections are performed based on the Tone/Polarization signal outputted from the tuner. To be specific, the polarized wave selection is decided using the Pola (Polarization) signal. The Band selection is decided using the Tone signal. More specifically, regarding the polarized wave, when DC electric power supplied from the tuner is 18 V, the polarized wave is decided to be horizontal (H). When the DC electric power supplied from the tuner is 13 V, the polarized wave is decided to be vertical (V). Moreover, regarding the Band, when there is a 22-kHz pulse signal superimposed on the DC electric power, it is decided to be High Band. When there is no 22-kHz pulse signal superimposed on the DC electric power, it is decided to be Low Band.

A selection operation in the down converter 1 will be explained specifically. The polarized wave selection is performed by the RF amplifiers 121 to 126 of the amplification unit 120 being controlled based on High (18 V)/Low (13 V) of the DC voltage. The Band selection is performed by controlling a frequency of the LO signal (the frequency-divided signal) inputted into the mixers 11, 21. That is, the Band selection is performed by controlling oscillation frequencies of the VCOs 133, 233.

To be specific, when down converting a High Band signal into the IF signal (1.1 GHz to 2.15 GHz), a frequency of the frequency-divided signal needs to be 10.6 GHz. Therefore, an oscillation frequency of the VCO is set to 21.2 GHz, twice of it. On the other hand, when down converting a Low Band signal into the IF signal (0.95 GHz to 1.95 GHz), the frequency of the frequency-divided signal needs to be 9.75 GHz. Therefore, the oscillation frequency of the VCO is set to 19.6 GHz, twice of it. Thereby, the down converter 1 performs an output selection as requested by the tuner.

Details of operational modes will be explained with reference to FIG. 6. FIG. 6 shows a table showing nine operational modes that the down convert IC 100 can take. The operational modes are eight modes except mode 9 where the whole down convert IC 100 turns OFF completely (both the OUT1 and the OUT2 are OFF).

As an example where only either of the OUT1 (to the tuner T11) or the OUT2 (to the tuner T21) is in an ON state, a state where only the OUT1 becomes ON by the horizontally polarized wave signal H and the OUT2 is in an OFF state (mode 1 of FIG. 6) will be explained. In the mode 1, since the down converter circuit 20 does not need to operate, the mixer 21, the PLL 23, the crystal oscillator 24, and IF amplifier 26 turn OFF. That is, in response to the OUT2 becoming OFF, an electric power supply to the three-terminal regulator REG21 is also suspended, and the three-terminal regulator REG21 also turns OFF. For this reason, it becomes that the power supply terminal 152 is supplied with no electric power. Therefore, when the OUT2 becomes OFF, the mixer 21, the PLL 23, the crystal oscillator 24, and the IF amplifier 26 turn OFF automatically. Incidentally, the power supply terminal 153 is supplied with electric power from the three-terminal regulator REG11.

At this time, a power supply control of the amplification unit 120 is performed by the Tone/Polarization control units 17, 27. Like the above-mentioned example, only the OUT1 becomes ON by the horizontally polarized wave signal H, and when the OUT2 is OFF, both the RF amplifier 124 for outputting the vertically polarized wave signal V and the RF amplifier 126 for outputting the horizontally polarized wave signal H to an OUT2 terminal turn OFF. Moreover, the RF amplifier 123 for outputting the vertically polarized wave signal V to an OUT1 terminal also turns OFF. Details of such a selection operation will be explained below.

In the case where electric power of the RF amplifiers 123 to 126 is supplied from the power supply terminal 153 as shown in FIG. 3, when electric power has been supplied to the power supply terminal 153, all of the RF amplifiers 123 to 126 turn ON. Therefore, when the OUT1 is in an OFF state, it is necessary to send power control signals for making the RF amplifiers 123, 125 turn OFF thereto. Similarly, when the OUT2 is in the OFF state, it is necessary to send the power control signals for making the RF amplifiers 124, 126 turn OFF thereto. Incidentally, the power control signal is a signal for switching an ON/OFF state of the RF amplifier.

The Tone/Polarization control unit 17 controls the ON/OFF states of the RF amplifiers 123, 125 using the power control signals. The Tone/Polarization control unit 27 controls the ON/OFF states of the RF amplifiers 124, 126 using the power control signals.

To be specific, when the down converter IC 100 is required to output the horizontally polarized wave signal H to the OUT1 terminal, the Pola signal of 18 V is inputted into the Tone/Polarization control unit 17 from the tuner on the OUT1 terminal side. Thereby, the Tone/Polarization control unit 17 makes the RF amplifier 123 turn OFF and makes the RF amplifier 125 turn ON using the power control signals. For example, when making the RF amplifier turn ON, the power control signal is set to a DC potential of High level; when making the RF amplifier turn OFF, the power control signal is set to a DC potential of Low level. Then, the Tone/Polarization control unit 17 is set so that when the OUT1 becomes OFF, the control signal outputted from the Tone/Polarization control unit 17 being not supplied with electric power may become a Low potential. This makes the down converter circuit 10 including the Tone/Polarization control unit 17 turn OFF (the OUT1 becomes OFF), and also makes both the RF amplifier 123 for outputting the vertically polarized wave signal V and the RF amplifier 125 for outputting the horizontally polarized wave signal H to the down converter circuit 10 turn OFF.

Similarly, when the down converter IC 100 is required to output the vertically polarized wave signal V to the OUT1 terminal, the Pola signal of 13 V is inputted into the Tone/Polarization control unit 17 from the tuner T11. Thereby, the Tone/Polarization control unit 17 makes the RF amplifier 123 turn ON and makes the RF amplifier 125 turn OFF using the power control signals.

Moreover, when the down converter IC 100 is required to output the horizontally polarized wave signal H to the OUT2 terminal, the Pola signal of 18 V is inputted into the Tone/Polarization control unit 27 from the tuner T21. Thereby, the Tone/Polarization control unit 27 makes the RF amplifier 124 turn OFF and makes the RF amplifier 126 turn ON using the power control signals. Similarly, when the down converter IC 100 is required to output the vertically polarized wave signal H to the OUT2 terminal, the Pola signal of 13 V is inputted into the Tone/Polarization control unit 27 from the tuner T21 on the OUT2 terminal side. Thereby, the Tone/Polarization control unit 27 makes the RF amplifier 124 turn ON and makes the RF amplifier 126 turn OFF using the power control signals. A control shown in FIG. 6 is performed by such controls.

Next, the case where both of the OUT1 and the OUT2 are ON will be explained. A case where the vertically polarized wave signal V is outputted to the OUT1 terminal and the horizontally polarized wave signal H is outputted to the OUT2 terminal is taken as one example (mode 8 of FIG. 6). When both the OUT1 and the OUT2 are ON, both of the three-terminal regulators REG11, REG21 turn ON. Therefore, all of the power supply terminals 151 to 153 are supplied with electric power. Therefore, the down converter circuits 10, 20 all turn ON. Moreover, also the RF amplifiers 121 to 126 all turn ON. Then, the Tone/Polarization control units 17, 27 control the RF amplifiers 123 to 126 using the power control signals based on the Pola signals inputted from the OUT1 and the OUT2 terminals, as described above. In the above-mentioned example, the Tone/Polarization control units 17, 27 makes the RF amplifier 125 for outputting the horizontally polarized wave signal H to the OUT1 terminal and the RF amplifier 124 for outputting the vertically polarized wave signal V to the OUT2 terminal turn OFF.

<Coupling in Down Convert IC 100>

Figure 7:
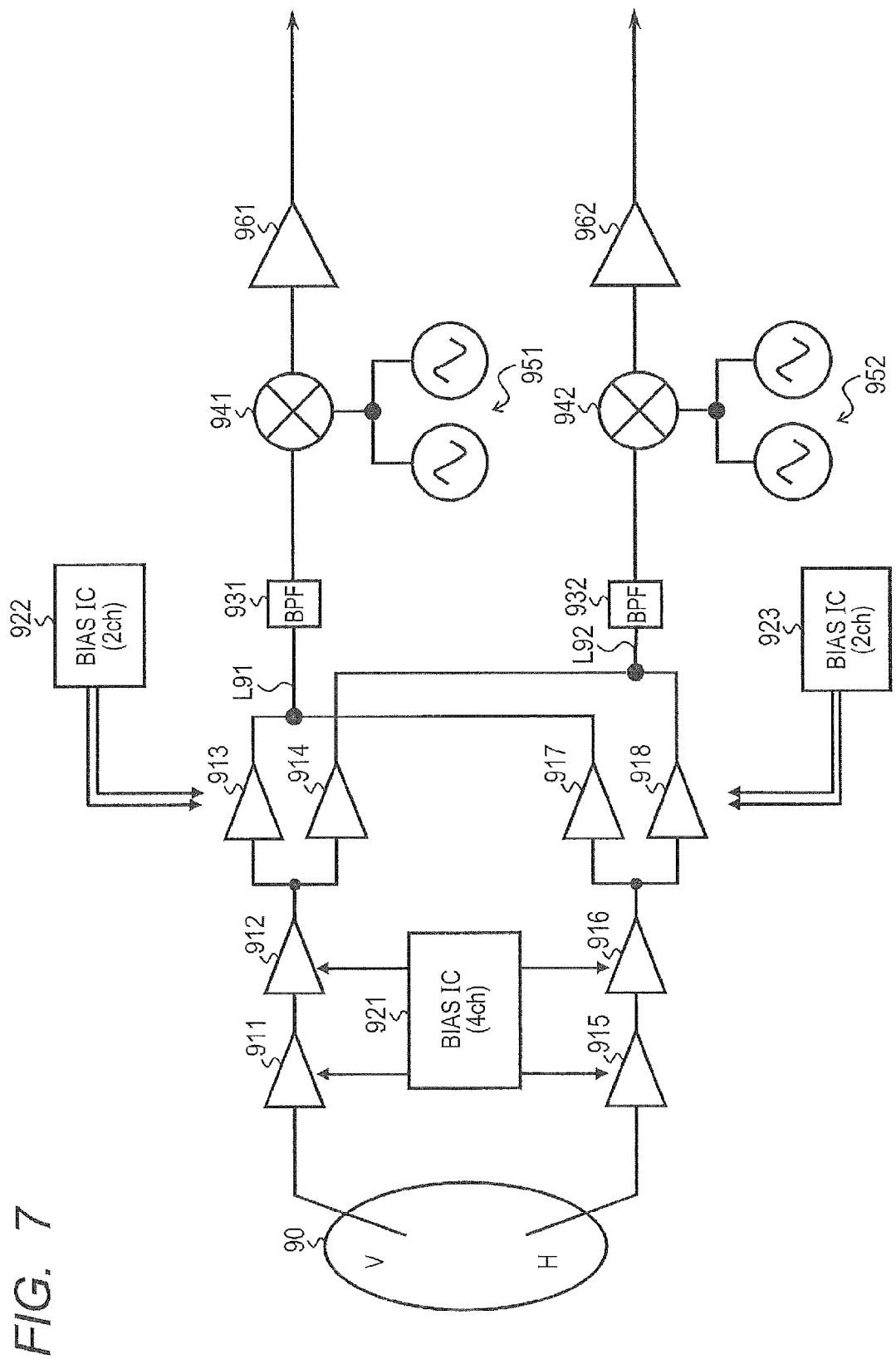
FIG. 7 is a block diagram of a down converter according to a comparative example.

Here, coupling in the down convert IC 100 will be explained. First, FIG. 7 shows a down converter that is a comparative example of the down converter 1 according to this embodiment. The down converter shown in FIG. 7 is of a discrete configuration, and is an LNB down converter of a universal dual configuration for outputting two IF signals.

The down converter shown in FIG. 7 has RF amplifiers 911 to 918, bias ICs 921 to 923, band-pass filters (BPFs) 931, 932, mixers (MIXs) 941, 942, VCOs 951, 952, and IF amplifiers 961, 962.

The RF amplifiers 911 to 914 amplify the vertically polarized wave signal V received with the feed horn 90. The RF amplifier 913 outputs the amplified vertically polarized wave signal V to the mixer 941 through the band-pass filter 931. The RF amplifier 914 outputs the amplified vertically polarized wave signal V to the mixer 942 through the band-pass filter 932. The RF amplifiers 915 to 918 amplify the horizontally polarized wave signal H received with the feed horn 90. The RF amplifier 917 outputs the amplified vertically polarized wave signal V to the mixer 941 through the band-pass filter 931. The RF amplifier 918 outputs the amplified vertically polarized wave signal V to the mixer 942 through the band-pass filter 932.

The bias IC 921 supplies electric power to the RF amplifiers 911, 912, 915, and 916. The bias IC 922 supplies electric power to the RF amplifiers 913, 917. The bias IC 923 supplies electric power to the RF amplifiers 914, 918.

Typically, the VCOs 951, 952 are DROs (Dielectric Resonator Oscillators), oscillate with oscillation frequencies set up in advance, and generate the local oscillation frequency signals, respectively. The VCO 951 outputs the generated local oscillation frequency signal to the mixer 941. The VCO 952 outputs the generated local oscillation frequency signal to the mixer 942.

The mixer 941 down converts the vertically polarized wave signal V or the horizontally polarized wave signal H inputted from the band-pass filter 931 using the local oscillation frequency signal inputted from the VCO 951. Thereby, the IF signal is outputted from the mixer 941. The IF amplifier 961 amplifies the IF signal inputted from the mixer 941, and outputs it to an unillustrated tuner.

Similarly, the mixer 942 down converts the vertically polarized wave signal V or the horizontally polarized wave signal H inputted from the band-pass filter 932 using the oscillation frequency signal inputted from the VCO 952. Thereby, the IF signal is outputted from the mixer 942. The IF amplifier 962 amplifies the IF signal inputted from the mixer 942, and outputs it to an unillustrated tuner.

Figure 8:
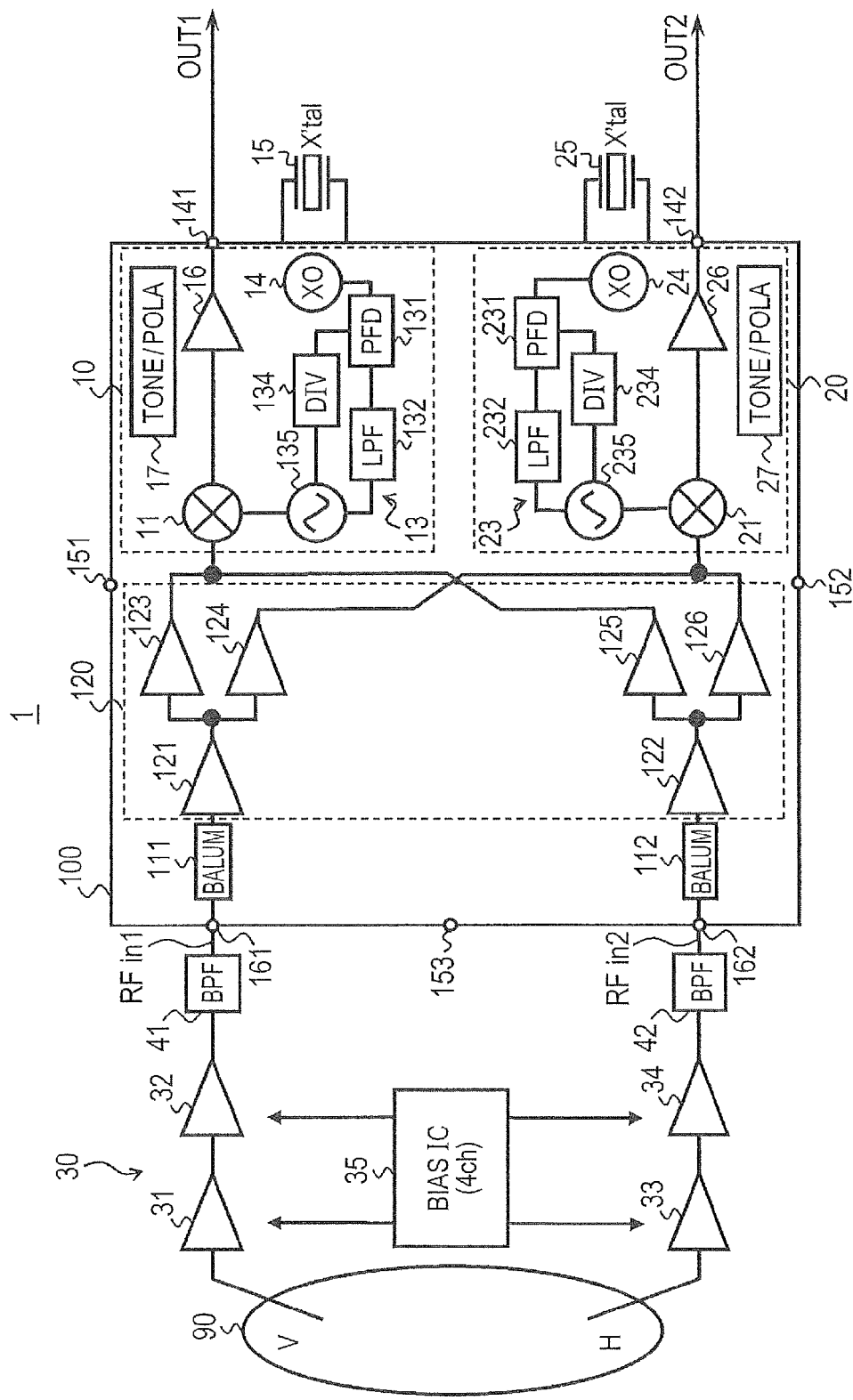
FIG. 8 is a block diagram of the down converter according to the comparative example.
Figure 9:
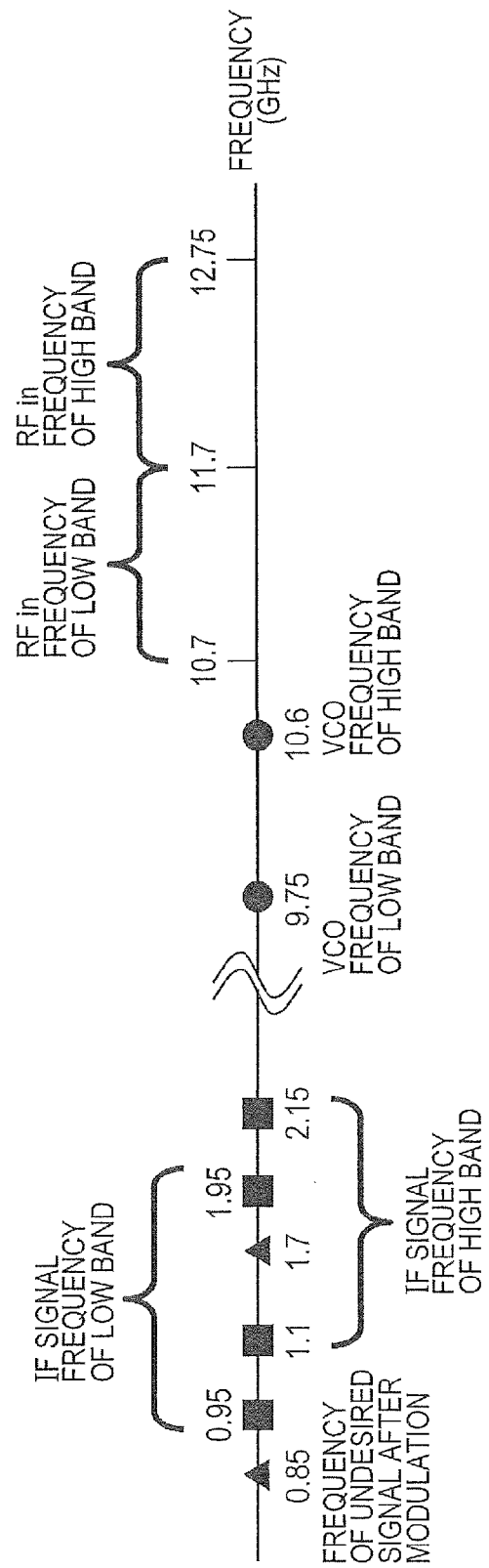
FIG. 9 is a diagram for explaining coupling of the down converter according to the comparative example.

Furthermore, FIG. 8 shows a block diagram of a comparative example in which a degree of integration of the down converter shown in FIG. 7 is raised to have a structure with an IC for dual configuration. Moreover, FIG. 9 shows a relationship among a frequency of the input signal RFin, a frequency of the IF signal, and the oscillation frequency of the VCO in the down converter shown in FIG. 8. Incidentally, although the down converter shown in FIG. 8 and the down converter shown in FIG. 1 are different in the existence of the ½ frequency-dividers 12, 22 and the oscillation frequency of the VCO, other configurations are the same, and therefore detailed explanations are omitted.

First, a frequency band of the input signal RFin of Low Band is 10.7 GHz to 11.7 GHz. A frequency band of the input signal RFin of High Band is 11.7 GHz to 12.75 GHz. Moreover, the oscillation frequency (the frequency of the local oscillation frequency signals) of VCOs 135, 235 of Low Band is 9.75 GHz. An oscillation frequency of the VCOs 135, 235 of High Band is 10.6 GHz. That is, the VCOs 135, 235 can selectively output the local oscillation frequency signal of 9.75 GHz or 10.6 GHz. Furthermore, the IF signal to which the mixer down converts the input signal RFin of Low Band using the local oscillation frequency signal of Low Band lies in a range of 0.95 GHz to 1.95 GHz. The IF signal to which the mixer down converts the input signal RFin of High Band using the local oscillation frequency signal of High Band lies in a range of 1.1 GHz to 2.15 GHz.

A problem of the down converter according to the comparative example shown in FIG. 8 is that two VCOs (the VCOs 135, 235) (capable of selecting 9.75 GHz or 10.6 GHz) having an equal built-in inductance exist and two built-in baluns (baluns 111, 112) each for converting a single phase input of the RF signal into a hi-phase signal exist. That is, since total four elements each with a mutual induction characteristic are provided in a single IC, the coupling is caused.

The coupling will be explained specifically. For example, in FIG. 8, let it be supposed that a frequency of the input signal RFin1 inputted into the input terminal 161 is 11.7 GHz, an oscillation frequency of the VCO 135 is selected to be 9.75

GHz, a frequency of the input signal RFin2 inputted into the input terminal 162 is 11.7 GHz, and an oscillation frequency of the VCO 235 is selected to be 10.6 GHz.

In this case, the balun 111 into which the input signal RFin1 (11.7 GHz) is inputted will couple with an inductor (10.6 GHz) of the VCO 235. Therefore, two waves of an 11.7-GHz signal (a signal inputted from the input terminal 161) and a 10.6-GHz undesired signal (a signal that arises by the coupling) are sent to the mixer 11 of the down converter circuit 10.

In the mixer 11, the above-mentioned two signals are mixed with a 9.75-GHz LO signal (the local oscillation frequency signal outputted from the PLL 13), respectively. Thereby, a 0.85-GHz undesired IF signal is generated in addition to a 1.95-GHz IF signal that should be generated originally. Although a frequency (0.85 GHz) of the undesired signal after down conversion (after modulation) is outside the IF band, since it is a component by the coupling from the VCO 235 with a large amplitude to the balun, an influence of its second harmonic (1.7 GHz) cannot be disregarded. As shown in FIG. 9, this second harmonic (1.7 GHz) is of a frequency included within the IF band. That is, a frequency of the second harmonic is frequency included in the receive frequency band of the tuner. Therefore, if the undesired signal in this IF band is outputted to the OUT1 terminal, there will be a possibility that the tuner T11 may judge the undesired signal as a signal that should be received. Incidentally, the receive frequency band of the tuner means a band of frequencies that the tuner can receive (recognize), and in this embodiment, the IF band (0.95 GHz to 2.15 GHz) becomes a receive frequency band.

Furthermore, if the down converter is of a discrete configuration as shown in FIG. 7, the above-mentioned coupling can be suppressed by a substrate design of providing a shield etc. in each individual circuit block, although incurring an additional cost. However, if it is made into an IC so as to be of a single chip configuration like the down converter shown in FIG. 8, although there are some merits, such as space-saving, it is realistically difficult to provide a shield etc. for every individual circuit block and it also increases a cost. Therefore, if the universal dual configuration for outputting multiple IF signals was made in an IC as a single chip, there was a problem that the influence of the coupling could not be prevented.

Incidentally, the down converter shown in FIG. 7 and FIG. 8 is uniquely considered in order that the inventors of this application may explain the above-mentioned problem, and it is completely an example of reference. Therefore, the above-described explanation including FIG. 7 and FIG. 8 does not form an advanced technology at all.

By contrast, in the down convert IC 100 according to this embodiment, an oscillation frequency of the VCO 133 is previously set to a frequency of twice a frequency of a signal that is intended to be inputted as an LO signal of the mixer 11. In addition, the ½ frequency-divider 12 is provided between the VCO 133 and the mixer 11. Similarly, an oscillation frequency of the VCO 233 is previously set to a frequency of twice a frequency of a signal that is intended to be inputted as an LO signal of the mixer 21. In addition, the ½ frequency-divider 22 is provided between the VCO 233 and the mixer 21. Thus, by setting the oscillation frequency of the VCO to twice a frequency of the desired LO signal, a frequency of the signal that is to be coupled to a balun also becomes twice the frequency.

The coupling of the down convert IC 100 will be explained using a specific example. For example, let it be supposed that the input signal RFin1 inputted into the input terminal 161 is in Low Band, and the frequency of the input signal RFin1 is 11.7 GHz. Moreover, let it be supposed that the oscillation frequency of the VCO 133 is 19.5 GHz. Furthermore, let it be supposed that the input signal RFin2 inputted into the input terminal 162 is in High Band, and the frequency of the input signal RFin2 is 11.7 GHz. Still moreover, let it be supposed that the oscillation frequency of the VCO 233 is 21.2 GHz.

Here, a 21.2-GHz local oscillation frequency signal generated by the VCO 233 couples to the balun 111. That is, two waves of the proper input signal RFin1 (11.7 GHz) and the undesired signal (21.2 GHz) resulting from the coupling are inputted into the mixer 11.

At this time, a high frequency component like of 21.2 GHz (the undesired signal) is decreased due to bands that the RF amplifiers 121, 123 in a front stage of the mixer 11 have by themselves. Then, the decreased undesired signal is inputted into the mixer 11.

Figure 10:
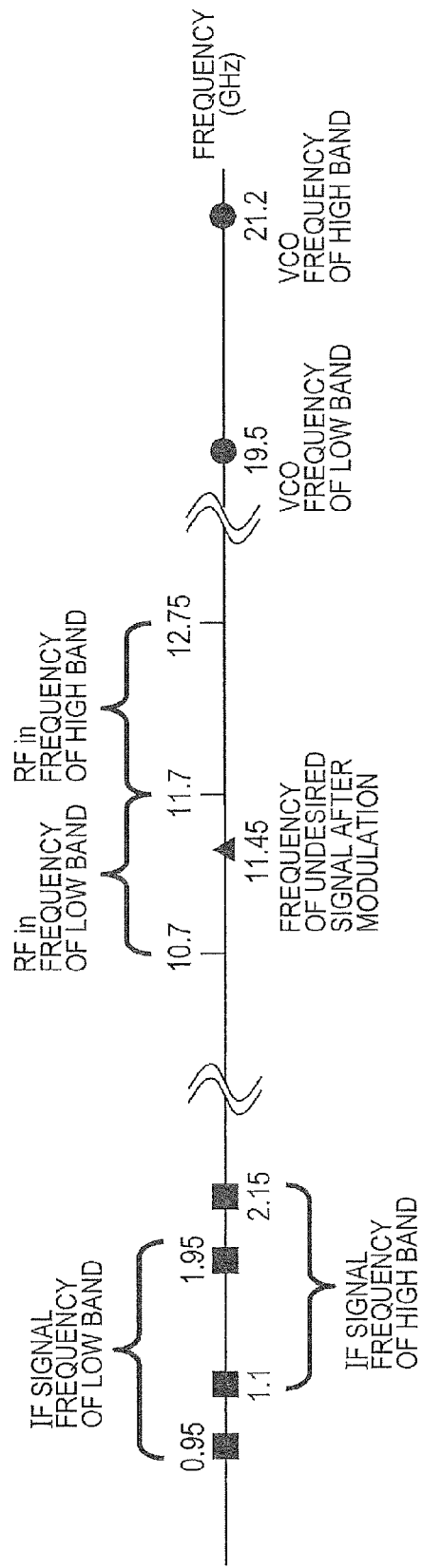
FIG. 10 is a diagram for explaining coupling of the down converter according to the first embodiment.

A frequency of the proper input signal RFin1 is down converted to 1.95 GHz from 11.7 GHz, and a frequency of the undesired signal is down converted to 11.45 GHz from 21.2 GHz (refer to FIG. 10). That is, the frequency of the undesired signal after the down conversion is in a band away from the frequency of the input signal RFin1 after down conversion. Therefore, even if the undesired signal is inputted into the mixer 11, the undesired signal after the modulation is easily removable using a filter etc. in the tuner T11 not shown in this diagram. That is, the oscillation frequency of the VCO is controlled so that the frequency of the undesired signal (the IF signal) after the down conversion in the mixer may become outside the receive frequency band of the tuner. However, as shown in FIG. 9, even when the frequency of the undesired signal after the down conversion is outside the receive frequency band of the tuner, its second order harmonic, third order harmonic, etc. may influence. Therefore, the oscillation frequency of the VCO is controlled so that the frequency of the undesired signal after the down conversion may become a higher frequency than those of the receive frequency band of the tuner.

To be more in detail, the frequency of the undesired signal (the IF signal) after being down converted in the mixer 11 is a difference frequency between the oscillation frequency of the VCO 233 and a frequency-divided signal inputted into the mixer 11. Therefore, the oscillation frequency of the VCO 133 is set so that a difference frequency between a frequency of the local oscillation frequency signal of the VCO 233 and a frequency of the frequency-divided signal of the ½ frequency-divider 12 may become a higher frequency than those of the receive frequency band (the IF band) of the tuner T11. Similarly, the oscillation frequency of the VCO 233 is set so that a difference frequency between a frequency of the local oscillation frequency signal of the VCO 133 and a frequency of the frequency-divided signal of the ½ frequency-divider 22 may become a higher frequency than those of the receive frequency band (the IF band) of the tuner T21.

Incidentally, in the case where the input signal RFin1 is in High Band and the input signal RFin2 is in Low Band, a situation opposite to what was described above should just be considered. Moreover, also in the case where both of the input signals RFin1, RFin2 are in High Band or in Low Band, the undesired signal can be removed by the same principle.

As described above, according to the configuration of the down converter 1 according to this embodiment, the ½ frequency-divider 12 is provided between the mixer 11 and the VCO 133. Then, the VCO 133 generates the local oscillation frequency signal so that a difference frequency between a frequency of the local oscillation frequency signal generated by the VCO 133 and a frequency of the frequency-divided signal inputted into the mixer 21 may become a higher frequency than those of the receive frequency band of the tuner T11. Similarly, the ½ frequency-divider 22 is provided between the mixer 21 and the VCO 233. Then, the VCO 233 generates the local oscillation frequency signal so that a difference frequency between a frequency of the local oscillation frequency signal generated by the VCO 233 and the frequency of the frequency-divided signal inputted into the mixer 21 may become a higher frequency than those of the receive frequency band of the tuner T11.

Thereby, even if the coupling occurs, the frequency of the undesired signal after the down conversion has a frequency outside the receive frequency band of the tuner. Therefore, even when the coupling arises and the undesired signal is also inputted into the mixer in addition to the input signal RFin, it is possible to easily remove the undesired signal after the down conversion in the tuner.

Furthermore, the ½ frequency-dividers 12, 22 each frequency divide the frequency of the local oscillation frequency signal. Thereby, the local oscillation frequency signal is converted into signals (frequency-divided signals) of frequencies that should be inputted into the mixers 11, 21 as the LO signals, respectively. Therefore, the local oscillation frequency signal whose oscillation frequency is doubled in order to make the undesired signal removable can be used for the down-conversion as the LO signal. As a result, the down converter 1 is enabled to output the two IF signals by using both of the two mixers 11, 21 for the down-conversion, which can realize the universal dual configuration.

Second Embodiment

Figure 11:
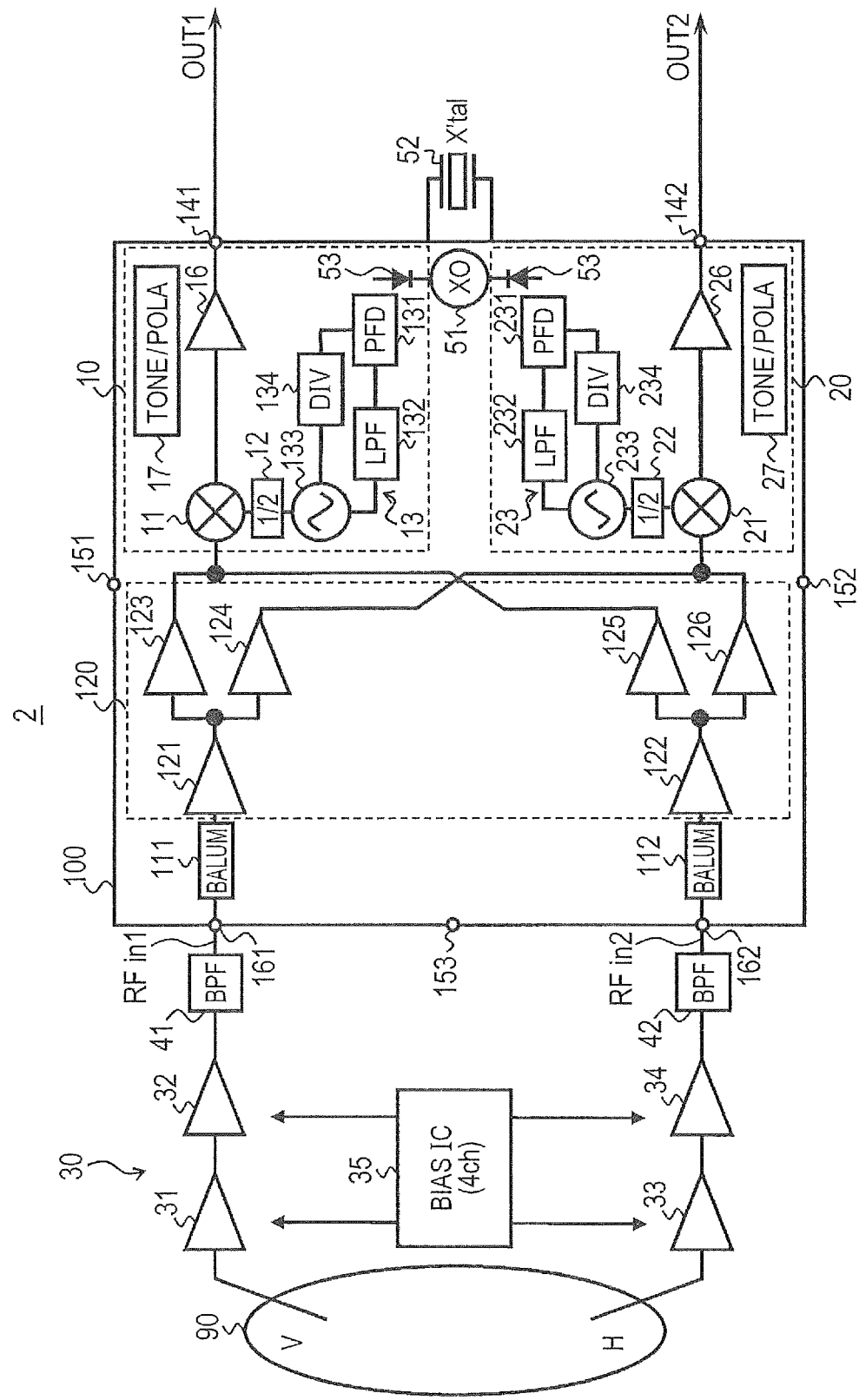
FIG. 11 is a block diagram of a down converter according to a second embodiment.

A down converter 2 according to a second embodiment will be described. FIG. 11 shows a block diagram of the down converter 2 according to this embodiment. The down converter 2 is different from the down converter 1 according to the first embodiment in having common crystal oscillator 51 and crystal resonator 52. Incidentally, since other configurations thereof are the same as those of the down converter 1, their explanations are omitted appropriately.

That is, a block used in common for the OUT1 and for the OUT2 also includes the crystal oscillator 51 that is made shared therebetween in addition to the RF amplifiers 121 to 126. This crystal oscillator 51 is coupled with the power supply terminals 151, 152 through diodes 53. Therefore, if at least one of the power supply terminal 151 and the power supply terminal 152 is supplied with electric power, the crystal oscillator 51 can operate.

Figure 12:
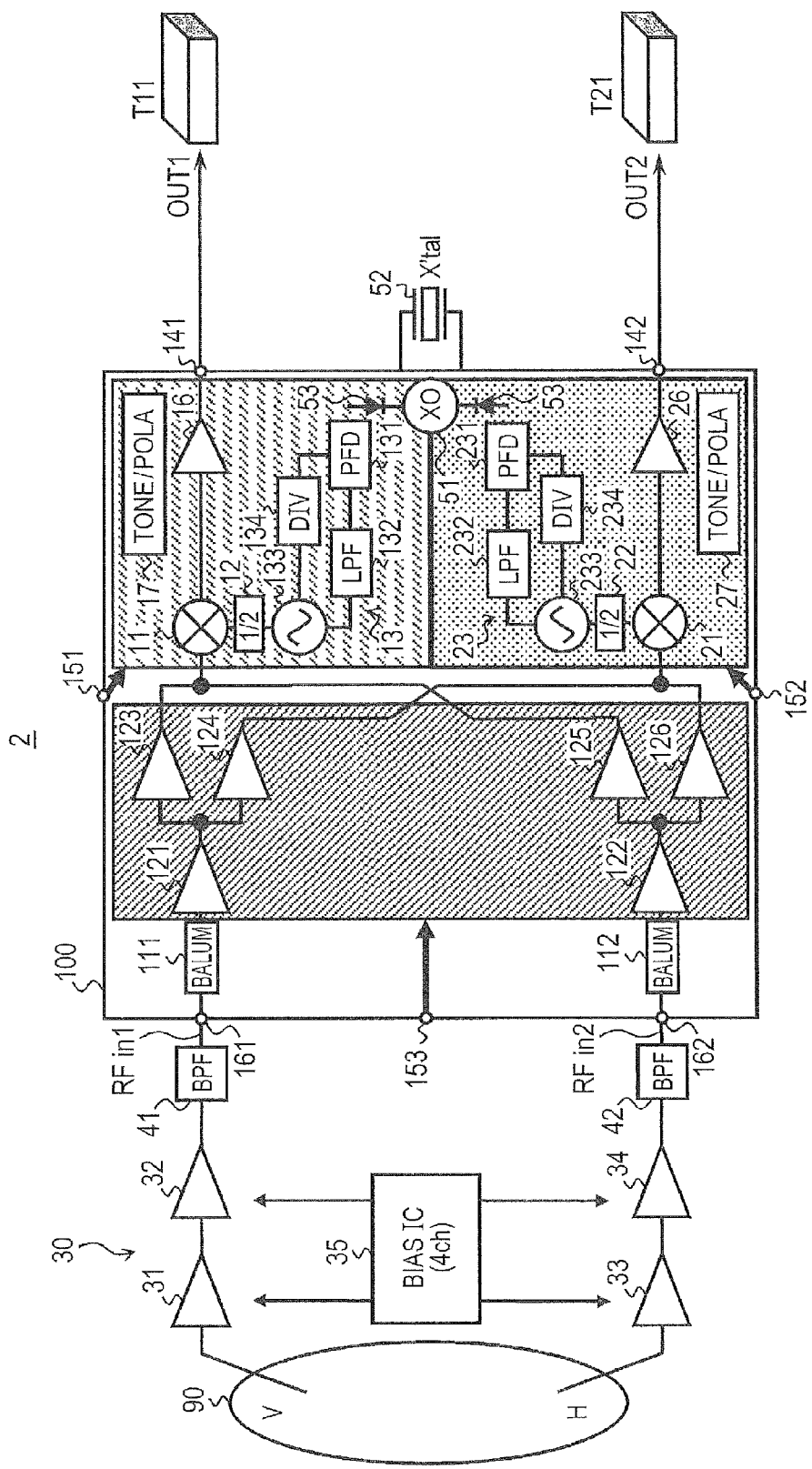
FIG. 12 is a diagram for explaining supply destinations of electric power in the down converter according to the second embodiment.

FIG. 12 is a block diagram showing supply destinations of electric power of the power supply terminals 151 to 153 in the down converter 2. FIG. 13 is a table showing supply destinations of electric power of the power supply terminals 151 to 153 in the down converter 2. Moreover, FIG. 14 shows a control operation of the down converter 2. A different point from the first embodiment is a point that the crystal oscillator 51 becomes one as described above, and its block becomes an always-ON block. In the example shown in FIG. 12, the crystal oscillator 51 is coupled with the power supply terminals 151, 152 through the diodes 53, and if being supplied with electric power from one of the power supply terminals 151, 152, the crystal oscillator 51 will be in an operable state (refer to FIG. 13).

In the first embodiment, the crystal oscillators 14, 24 turned ON/OFF according to output situations of the OUT1 and the OUT2 (refer to FIG. 6). By contrast, as is clear from the operational mode table of FIG. 14, in any time except when both the OUT1 and the OUT2 are OFF, the crystal oscillator 51 is always ON irrespective of the output situations of the OUT1 and the OUT2 because the crystal oscillator 51 has been shared by the down converter circuits 10, 20.

Incidentally, the down converter 2 has two PLLs of identical configuration and function. That is, the PLL 13 and the PLL 23 are the PLLs having the same circuit configuration and function. For this reason, frequencies of two reference signals (the first and the second reference signals) inputted into the PLL 13 and the PLL 23 are also equal. Therefore, the crystal resonator 52 used by the crystal oscillator 51 for making a reference signal can be shared.

As described above, according to the configuration of the down converter 2 according to this embodiment, the down converter circuit 10 and the down converter circuit 20 are sharing the crystal oscillator 51 and the crystal resonator 52. Thereby, reduction of part cost and reduction of a circuit scale of the down converter 2 can be attained.

Third Embodiment

Figure 15:
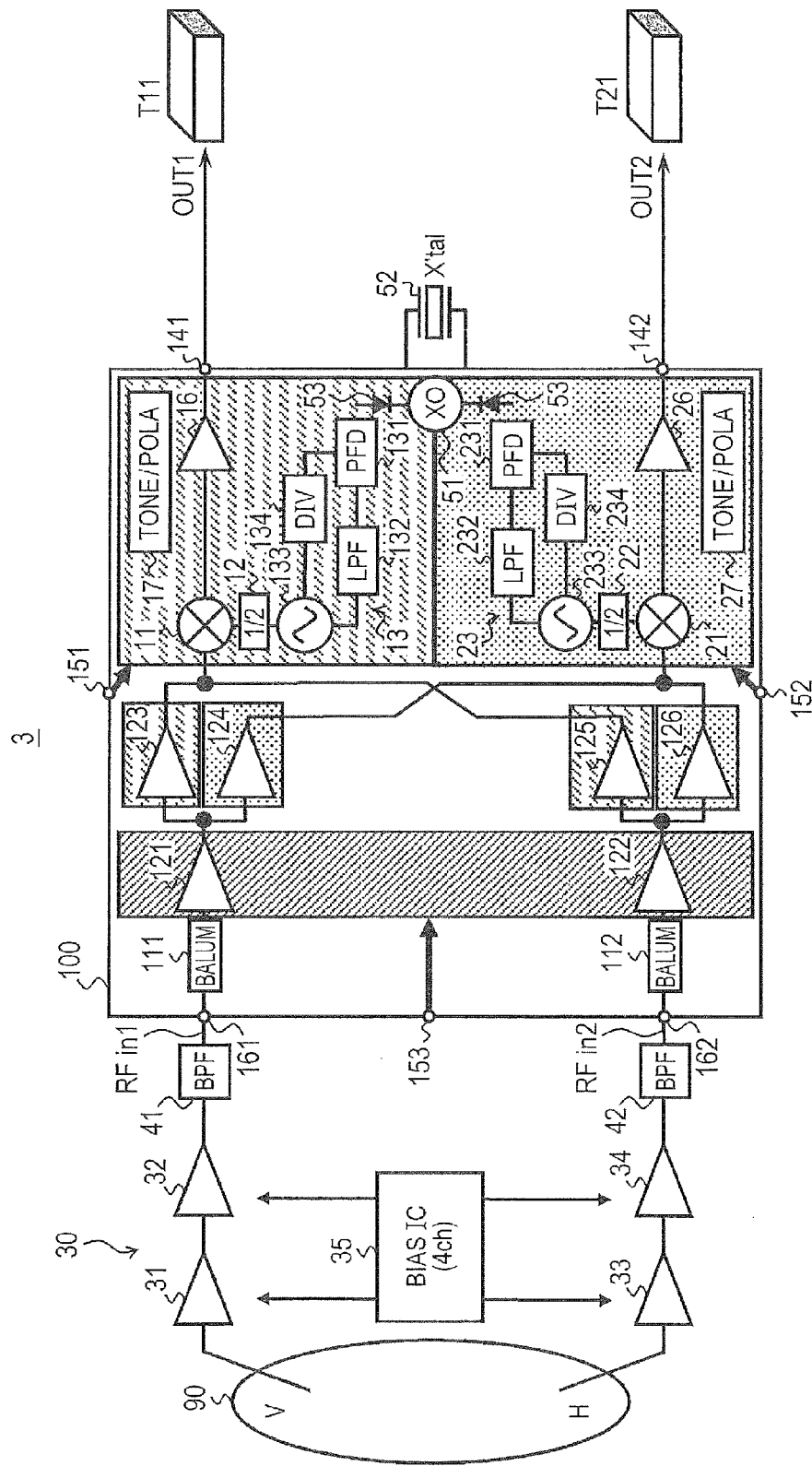
FIG. 15 is a diagram for explaining supply destinations of electric power in a down converter according to a third embodiment.

A down converter 3 according to a third embodiment will be described. FIG. 15 shows a block diagram showing supply destinations of electric power of the power supply terminals 151 to 153 in the down converter 3 according to this embodiment. Moreover, FIG. 16 shows a table showing the supply destinations of electric power of the power supply terminals 151 to 153 in the down converter 3. The down converter 3 is different in the power supply configuration from the down converter 2 according to the second embodiment. Incidentally, since other configurations thereof are the same as those of the down converter 2, their explanations are omitted appropriately.

To be specific, as shown in FIG. 15 and FIG. 16, the RF amplifiers 123, 125 are coupled to the power supply terminal 151, and are supplied with electric power from the power supply terminal 151. The RF amplifiers 124, 126 are coupled to the power supply terminal 152, and are supplied with electric power from the power supply terminal 152.

Thereby, the same control as the control shown in FIG. 13 can be realized. That is, when the down converter circuit 10 is OFF, the RF amplifiers 123, 125 turn OFF. Moreover, when the down converter circuit 20 is OFF, the RF amplifiers 124, 126 turn OFF. However, in the first and the second embodiments described above, the RF amplifiers 123 to 126 perform switching of ON/OFF in response to the power control signals from the Tone/Polarization control units 17, 27. By contrast, in this embodiment, when the OUT1 turns OFF, since the electric power supply from the power supply terminal 151 is lost, the RF amplifiers 123, 125 turn OFF automatically. Similarly, when the OUT2 turns OFF, since the electric power supply from the power supply terminal 152 is lost, the RF amplifiers 124, 126 turn OFF automatically.

On the other hand, in a state of the OUT1 being ON, a selection operation of the horizontally polarized wave signal H or the vertically polarized wave signal V is realized by the Tone/Polarization control unit 17 controlling the RF amplifiers 123, 125, like the first and the second embodiments. Similarly, in a state of the OUT2 being ON, the selection operation of the horizontally polarized wave signal H or the vertically polarized wave signal V is realized by the Tone/Polarization control unit 27 controlling the RF amplifiers 124, 126.

As described above, according to the configuration of the down converter 3 according to this embodiment, the RF amplifiers 123, 125 are coupled to the power supply terminal 151 from which the down converter circuit 10 is supplied with electric power. Moreover, the RF amplifiers 124, 126 are coupled to the power supply terminal 152 from which the down converter circuit 20 is supplied with electric power.

Thereby, when the down converter circuit 10 is OFF, the RF amplifiers 124, 126 turn OFF automatically. Moreover, when the down converter circuit 20 is OFF, the RF amplifiers 123, 125 turn OFF automatically. Therefore, when the Tone/Polarization control units 17, 27 are OFF, it is not necessary to perform a power supply control of the RF amplifiers 123 to 126. As a result, processings of the Tone/Polarization control units 17, 27 can be simplified.

In the foregoing, although the invention made by these inventors was explained specifically based on the embodiments, it goes without saying that the present invention is not limited to the embodiments already described and various modifications are possible within a range that does not deviate from the gist of the present invention.

For example, in the embodiments described above, although the ½ frequency-divider was provided between the mixer and the VCO, embodiments are not limited to this configuration. A ⅓ frequency-divider and a 1/1.5 frequency-divider may be used in place of the ½ frequency-divider. In the case of using the ⅓ frequency-divider, what is necessary is just to set the oscillation frequency of the VCO to 9.75 GHz×3=29.25 GHz or 10.6 GHz×3=31.8 GHz. Similarly, in the case of using the 1/1.5 frequency-divider, what is necessary is just to set the oscillation frequency of the VCO to 9.75 GHz×1.5=14.625 GHz or 10.6 GHz×3=15.9 GHz. Even if these local oscillation frequency signals are subjected to the coupling and are inputted into the mixer, the frequency of the undesired signal after the down conversion becomes 29.25 GHz−10.6 GHz=18.6 GHz or 14.625 GHz−10.6 GHz=4.025 GHz, for example. That is, in any case, it is a frequency higher than 0.95 GHz to 2.15 GHz that is the IF band (the receive frequency band of the tuner). As a result, the undesired signal can be easily removed.

However, other frequency-dividers (e.g., a ⅓ frequency-divider, a 1/1.5 frequency-divider, etc.) are difficult in circuit design and are also high-cost compared with the ½ frequency-divider. Moreover, in the case of a frequency-divider (e.g., a ⅓ frequency-divider, a ¼ frequency-divider, etc.) whose frequency division ratio is smaller than ½, the oscillation frequency in the VCO must be made higher by that amount. As a result, the local oscillation frequency signal of a high frequency is generated. At this time, although a buffer amplifier etc. is provided between the VCO and the frequency-divider, the higher the local oscillation frequency, the higher power the local oscillation frequency signal needs to have. As a result, the power consumption increases. Therefore, it is desirable that the frequency-dividers (the first and the second frequency-dividers) provided between the VCOs and the mixers should be the ½ frequency-dividers.

Incidentally, in the embodiments described above, although the down converter 1 had the two down converter circuits of the down converter circuits 10, 20, the number of the down converter circuits is not limited to two. It is needless to say that the down converter may have three or more down converter circuits.

What is claimed is:

1. A down converter, comprising:
   an amplification unit including:
   a first amplifier to which a first polarized wave signal is supplied; and
   a second amplifier to which a second polarized wave signal is supplied;
   a first down converter circuit including:
   a first reference signal generation unit for generating a first reference signal;
   a first local oscillation unit for generating a first local oscillation frequency signal using the first reference signal;
   a first frequency-divider for generating a first frequency-divided signal obtained by frequency dividing the first local oscillation frequency signal; and
   a first frequency conversion unit for converting a signal amplified by the amplification unit into a first intermediate frequency signal using the first frequency-divided signal; and
   a second down converter circuit including:
   a second reference signal generation unit for generating a second reference signal;
   a second local oscillation unit for generating a second local oscillation frequency signal using the second reference signal;
   a second frequency-divider for generating a second frequency-divided signal obtained by frequency dividing the second local oscillation frequency signal; and
   a second frequency conversion unit for converting a signal amplified by the amplification unit into a second intermediate frequency signal using the second frequency-divided signal,
   wherein a difference frequency between a frequency of the second local oscillation frequency signal and a frequency of the first frequency-divided signal is higher than an upper limit of a receive frequency band of a first receiver for receiving the first intermediate frequency signal.

2. The down converter according to claim 1, wherein a difference frequency between a frequency of the first local oscillation frequency signal and a frequency of the second frequency-divided signal is higher than an upper limit of a receive frequency band of a second receiver for receiving the second intermediate frequency signal.

3. The down converter according to claim 1, wherein the first frequency-divider is a ½ frequency-divider.

4. The down converter according to claim 1, wherein the second frequency-divider is a ½ frequency-divider.

5. The down converter according to claim 1, wherein the first and the second local oscillation units can select oscillation frequencies, respectively, and oscillate at a frequency of 19.5 GHz or 21.2 GHz, respectively.

6. The down converter according to claim 1, wherein the first local oscillation unit and the second local oscillation unit are of substantially the same circuit configuration.

7. The down converter according to claim 6, wherein the first and the second reference signal generation units have a common crystal oscillation circuit and the crystal oscillation circuit generates the first and the second reference signals using a single crystal resonator.

8. The down converter according to claim 1, wherein a transformer is coupled to an input side of the amplification unit.

9. The down converter according to claim 1, further comprising a first to a third power supply terminals, wherein the first down converter circuit is supplied with electric power through the first power supply terminal, wherein the second down converter circuit is supplied with electric power through the second power supply terminal, and wherein the amplification unit is supplied with electric power through the third power supply terminal.

10. The down converter according to claim 1,
further comprising a first to a third power supply terminals,
wherein the amplification unit further comprises:
- a third amplifier that inputs therein a signal outputted from the first amplifier, amplifies the signal, and outputs it to the first down converter circuit;
- a fourth amplifier that inputs therein the signal outputted from the first amplifier, amplifies the signal, and outputs it to the second down converter circuit;
- a fifth amplifier that inputs therein a signal outputted from the second amplifier, amplifies the signal, and outputs it to the first down converter circuit;
- a sixth amplifier that inputs therein the signal outputted from the second amplifier, amplifies the signal, and outputs it to the second down converter circuit,
- wherein the first down converter circuit, the third amplifier, and the fifth amplifier are supplied with electric power through the first power supply terminal,
- wherein the second down converter circuit, the fourth amplifier, and the sixth amplifier are supplied with electric power through the second power supply terminal, and
- wherein the first amplifier and the second amplifier are supplied with electric power through the third power supply terminal.

11. The down converter according to claim 1,
wherein the amplification unit, the first down converter circuit, and the second down converter circuit are formed over a single IC chip.

12. A method for controlling a down converter comprising:
an amplification unit that has a first amplifier to which a first polarized wave signal is supplied and a second amplifier to which a second polarized wave signal is supplied;
a first down converter circuit that has
- a first reference signal generation unit for generating a first reference signal having a first reference frequency,
- a first local oscillation unit for generating a first local oscillation frequency signal using the first reference signal,
- a first frequency-divider for generating a first frequency-divided signal obtained by frequency dividing the first local oscillation frequency signal, and
- a first frequency conversion unit for converting a signal amplified by the amplification unit into a first intermediate frequency signal using the first frequency-divided signal; and a second down converter circuit that has
- a second reference signal generation unit for generating a second reference signal having a second reference frequency,
- a second local oscillation unit for generating a second local oscillation frequency signal using the second reference signal,
- a second frequency-divider for generating a second frequency-divided signal obtained by frequency dividing the second local oscillation frequency signal, and
- a second frequency conversion unit for converting a signal amplified by the amplification unit into a second intermediate frequency signal using the second frequency-divided signal,
wherein an oscillation frequency of the second local oscillation unit is controlled so that a difference frequency between a frequency of the second local oscillation frequency signal and a frequency of the first frequency-divided signal may become higher than an upper limit of a receive frequency band of a first receiver for receiving the first intermediate frequency signal.

* * * * *